(12) United States Patent
Nishimura et al.

(10) Patent No.: US 8,847,218 B2
(45) Date of Patent: Sep. 30, 2014

(54) ORGANIC ELECTROLUMINESCENT ELEMENT

(75) Inventors: Kazuki Nishimura, Sodegaura (JP); Yukitoshi Jinde, Sodegaura (JP); Toshinari Ogiwara, Sodegaura (JP); Tetsuya Inoue, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/980,051

(22) PCT Filed: Jan. 20, 2012

(86) PCT No.: PCT/JP2012/051194
§ 371 (c)(1),
(2), (4) Date: Jul. 17, 2013

(87) PCT Pub. No.: WO2012/099241
PCT Pub. Date: Jul. 26, 2012

(65) Prior Publication Data
US 2013/0292664 A1     Nov. 7, 2013

(30) Foreign Application Priority Data
Jan. 20, 2011  (JP) ................. 2011-009660

(51) Int. Cl.
*H01L 51/50* (2006.01)
*H05B 33/14* (2006.01)
*C09B 57/00* (2006.01)
*C09B 57/10* (2006.01)

(52) U.S. Cl.
CPC ........ *H01L 51/5012* (2013.01); *H01L 51/5044* (2013.01); *H01L 2251/552* (2013.01); *H01L 2251/558* (2013.01); *H05B 33/145* (2013.01); *H01L 51/5016* (2013.01); *C09B 57/00* (2013.01); *C09B 57/10* (2013.01)

USPC .............................................. 257/40; 257/98

(58) Field of Classification Search
CPC ............... H01L 2251/552; H01L 51/0067; H01L 51/0072; H01L 51/5012; H01L 51/0059; H01L 51/006; H01L 51/5016; H01L 2251/558; H01L 51/0061; H01L 51/0073; H01L 51/0085; H01L 51/5044
USPC ........................................................ 257/40
See application file for complete search history.

(56) References Cited

U.S. PATENT DOCUMENTS

| | | | |
|---|---|---|---|
| 8,643,268 B2 * | 2/2014 | Ogiwara et al. | 313/504 |
| 2012/0248968 A1 * | 10/2012 | Ogiwara et al. | 313/504 |
| 2013/0020558 A1 * | 1/2013 | Ogiwara | 257/40 |
| 2014/0103329 A1 * | 4/2014 | Ogiwara et al. | 257/40 |

FOREIGN PATENT DOCUMENTS

| | | |
|---|---|---|
| JP | 10-237438 | 9/1998 |
| JP | 2006-172762 | 6/2006 |
| JP | 2006-330710 | 12/2006 |
| JP | 2007-227152 | 9/2007 |
| WO | WO 2004/034751 | 4/2004 |
| WO | WO 2005/006816 | 1/2005 |
| WO | WO 2005/079118 | 8/2005 |
| WO | WO 2008/056746 | 5/2008 |

OTHER PUBLICATIONS

Adachi et al., "Expression of Thermally-Activated Delayed Fluorescence of High Efficiency and Application Thereof to Oled", Organic EL Symposium, proceeding for the tenth meeting held on Jun. 17 (Thurs.) to 18 (Fri.) in 2010, S2-5, pp. 11-12.

Katsumi Tokumaru, "Organic Photochemical Reaction Theory", 1973, pp. 79-82, Tokyo Kagaku Dojin Co., Ltd.

Kang et al- "Prevention of H-Aggregates Formation in Cy5 Labeled Macromolecules", International Journal of Polymer Science, vol. 2010, Article ID 264781.

Kasha et al., "The Exciton Model in Molecular Spectroscopy", Pure and Applied Chemistry, 1965, pp. 371-392, vol. 11.

Das et al., "Can H-Aggregates Serve as Light-Harvesting Antennae? Triplet-Triplet Energy Transfer between Excited Aggregates and Monomer Thionine in Aersol-OT Solutions", J. Phys. Chem., B 1999, pp. 209-215, vol. 103, No. 1.

Yokoyama et al. "Horizontal orientation of linear-shaped organic molecules havig bulky substituents in neat and doped vacuum-deposited amorphous films", Organic Electronics, Feb. 1, 2009, pp. 127-137, vol. 10.

Yokoyama et al. "Horizontal molecular orientation in vacuum-deposited organic amorphous films of hole and electron transport materials", Applied Physics Letters, 2008, 93, 173302.

Yokoyama et al., "Enhancement of electron transport by horizontal molecular orientation of oxadiazole planar molecules in organic amorphous films", Applied Physics Letters, 2009, 95, 243303.

International Search Report for corresponding International Application No. PCT/JP2012/051194, Mar. 19, 2012.

International Preliminary Report on Patentability with Translation of Written Opinion of the International Searching Authority for corresponding Innernational Application No. PCT/JP2012/051194, Jul. 23, 2013.

* cited by examiner

*Primary Examiner* — Zandra Smith
*Assistant Examiner* — Lawrence Tynes, Jr.

(74) *Attorney, Agent, or Firm* — Oblon, Spivak, McClelland, Maier & Neustadt, L.L.P.

(57) ABSTRACT

An organic electroluminescence device includes a pair of electrodes and an organic compound layer interposed therebetween. The organic compound layer includes a plurality of emitting layers including a first emitting layer and a second emitting layer, in which at least one of the first and second emitting layers contains a phosphorescent dopant material, and a space layer between the first and second emitting layers. The space layer contains a compound satisfying a relationship of the following numerical formula (1) in terms of a difference $\Delta ST$ between singlet energy $EgS$ and an energy gap $Eg_{77K}$ at 77K,

[Numerical Formula 1]

$$\Delta ST = EgS - Eg_{77K} \leq 0.5 \text{ (eV)} \quad (1).$$

15 Claims, 8 Drawing Sheets

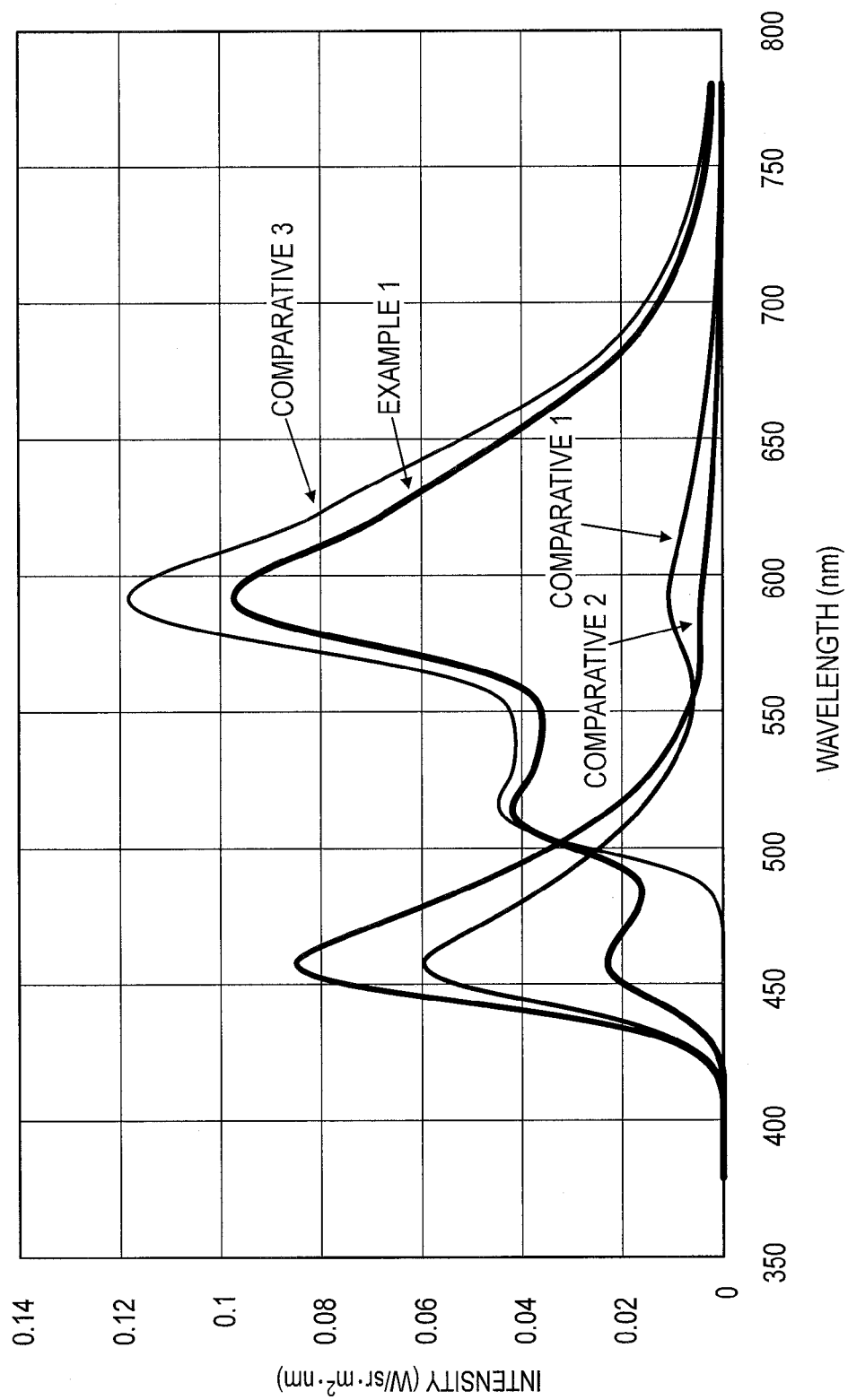

ORGANIC ELECTROLUMINESCENT ELEMENT

TECHNICAL FIELD

The present invention relates to an organic electroluminescence device.

BACKGROUND ART

When voltage is applied on an organic electroluminescence device (hereinafter, referred to as an organic EL device), holes and electrons are respectively injected into an emitting layer from an anode and a cathode. The injected electrons and holes are recombined in an emitting layer to form excitons. Here, according to the electron spin statistics theory, singlet excitons and triplet excitons are generated at a ratio of 25%:75%. In the classification according to the emission principle, in a fluorescent EL device which uses emission caused by singlet excitons, the limited value of an internal quantum efficiency of the organic EL device is believed to be 25%. On the other hand, in a phosphorescent EL device which uses emission caused by triplet excitons, it has been known that the internal quantum efficiency can be improved up to 100% when intersystem crossing efficiently occurs from the singlet excitons.

As an example of such an organic EL device with use of fluorescence and phosphorescence, a white-emitting organic EL device, in which a fluorescent-emitting material exhibiting a blue emission, a phosphorescent-emitting material exhibiting a red emission and a phosphorescent-emitting material exhibiting a green emission are used, has been proposed. However, it has been found that a luminous efficiency is low with an arrangement of simply layering a blue fluorescent-emitting layer, a red phosphorescent-emitting layer and a green phosphorescent-emitting layer, so that a study for improving the luminous efficiency has been made.

As a result, it has been found that, when the fluorescent-emitting layer and the phosphorescent-emitting layer are laminated adjacent to each other, holes and electrons are not recombined in the layers in good balance and, further, triplet energy of the phosphorescent-emitting material in the phosphorescent-emitting layer is transferred to the fluorescent-emitting material in the fluorescent-emitting layer. In view of this, it has been proposed to provide a space layer (occasionally also referred to as a blocking layer, a bipolar layer, an interlayer or the like) between the fluorescent-emitting layer and the phosphorescent-emitting layer.

For instance, an organic EL device disclosed in Patent Literature 1 includes a bipolar layer, through which holes and electrons can be transferred, between an emitting layer containing a fluorescent dopant material and an emitting layer containing a phosphorescent dopant material. The bipolar layer contains a compound having triplet energy larger than triplet energy of the phosphorescent dopant material. In Patent Literature 1, such a device arrangement enables to provide an organic EL device that inhibits Dexter transfer of triplet energy while maintaining carrier balance between the emitting layer containing the fluorescent dopant material and the emitting layer containing the phosphorescent dopant material, and exhibits excellent luminous efficiency and whiteness index.

CITATION LIST

Patent Literature(s)

Patent Document 1: JP-A-2006-172762

SUMMARY OF THE INVENTION

Problems to be Solved by the Invention

However, since the bipolar layer disclosed in Patent Literature 1 contains a compound having a large triplet energy, of which singlet energy is also large, injection and transportation of electrons and holes through the bipolar layer becomes difficult, thereby hampering improvement in the luminous efficiency and whiteness index. Accordingly, the bipolar layer needs to be formed by mixing a hole transporting material (NPB) and an electron transporting material (BCP), thereby promoting injection and transportation of electrons and holes and adjusting carrier balance.

An object of the invention is to provide an organic EL device having excellent luminous efficiency and color rendering property.

Means for Solving the Problems

After conducting concentrated studies in order to solve the above problem, the inventors found that a luminous efficiency and a color rendering property of an organic EL device is improved by using a compound satisfying specific conditions in a space layer, and reached the invention.

According to an aspect of the invention, an organic electroluminescence device includes a pair of electrodes and an organic compound layer between the pair of electrodes, in which the organic compound layer includes a plurality of emitting layers including a first emitting layer and a second emitting layer, at least one of the first and second emitting layers contains a phosphorescent dopant material, the organic compound layer includes a space layer between the first emitting layer and the second emitting layer, and the space layer contains a compound satisfying a relationship of the following numerical formula (1) in terms of a difference $\Delta ST$ between singlet energy EgS and an energy gap $Eg_{77K}$ at 77K.

[Numerical Formula 1]

$$\Delta ST = EgS - Eg_{77K} \leq 0.5 \text{ (eV)} \tag{1}$$

In the organic EL device according to the above aspect of the invention, it is preferable that the compound contained in the space layer has more than 80 nm of a half bandwidth of a photoluminescence spectrum.

In the organic EL device according to the above aspect of the invention, it is preferable that the compound contained in the space layer is a compound satisfying the following numerical formula (2) in terms of a refractive index $n_Z$ in a direction perpendicular to a silicon substrate surface and a refractive index $n_X$ in a direction parallel to the silicon substrate surface by a spectroscopic ellipsometry method.

[Numerical Formula 2]

$$\Delta n = |n_X - n_Z| > 0.04 \tag{2}$$

In the organic EL device according to the above aspect of the invention, it is preferable that the singlet energy EgS of the compound contained in the space layer satisfies a relationship of the following numerical formula (3).

[Numerical Formula 3]

$$EgS \geq 2.80 \text{ (eV)} \tag{3}$$

In the organic EL device according to the above aspect of the invention, it is preferable that the energy gap $Eg_{77K}$ of the compound contained in the space layer satisfies a relationship of the following numerical formula (4).

[Numerical Formula 4]

$$Eg_{77K} \geq 2.70 \text{ (eV)} \tag{4}$$

In the organic EL device according to the above aspect of the invention, it is preferable that the first emitting layer contains a phosphorescent dopant material and the second emitting layer contains a fluorescent dopant material.

In the organic EL device according to the above aspect of the invention, it is preferable that the first emitting layer and the second emitting layer contain a phosphorescent dopant material.

In the organic EL device according to the above aspect of the invention, it is preferable that a third emitting layer containing a phosphorescent dopant material is provided adjacent to the first emitting layer containing the phosphorescent dopant material.

In the organic EL device according to the above aspect of the invention, it is preferable that the third emitting layer contains a host material selected from compounds having a hole mobility larger than an electron mobility.

In the organic EL device according to the above aspect of the invention, it is preferable that the first emitting layer contains a host material selected from compounds having a hole mobility larger than an electron mobility.

According to another aspect of the invention, an organic EL device includes a pair of electrodes and an organic compound layer between the pair of electrodes, in which the organic compound layer includes at least one emitting layer and at least one charge transporting layer, and the charge transporting layer comprises a compound satisfying a relationship of the following numerical formula (5) in terms of a difference ΔST between singlet energy EgS and an energy gap $Eg_{77K}$ at 77K.

[Numerical Formula 5]

$$\Delta ST = EgS - Eg_{77K} \leq 0.5 \text{ (eV)} \tag{5}$$

In the organic EL device according to the above aspect of the invention, it is preferable that the compound contained in the charge transporting layer has more than 80 nm of a half bandwidth of a photoluminescence spectrum.

In the organic EL device according to the above aspect of the invention, it is preferable that the compound contained in the charge transporting layer is a compound satisfying the following numerical formula (6) in terms of a refractive index $n_Z$ in a direction perpendicular to a silicon substrate surface and a refractive index $n_X$ in a direction parallel to the silicon substrate surface by a spectroscopic ellipsometry method.

[Numerical Formula 6]

$$\Delta n = |n_X - n_Z| > 0.04 \tag{6}$$

According to the above aspect of the invention, since the compound satisfying the specific conditions is used in the space layer, even when the space layer is formed of a single material, an organic EL device having excellent luminous efficiency and color rendering property can be provided.

According to the another aspect of the invention, since the compound satisfying the specific conditions is used in the charge transporting layer, an organic EL device having excellent luminous efficiency and color rendering property can be provided.

BRIEF DESCRIPTION OF DRAWINGS

FIG. 8 shows a spectral radiance spectrum when organic EL devices are driven in Examples.

DESCRIPTION OF EMBODIMENTS

First Exemplary Embodiment

Figure 1:
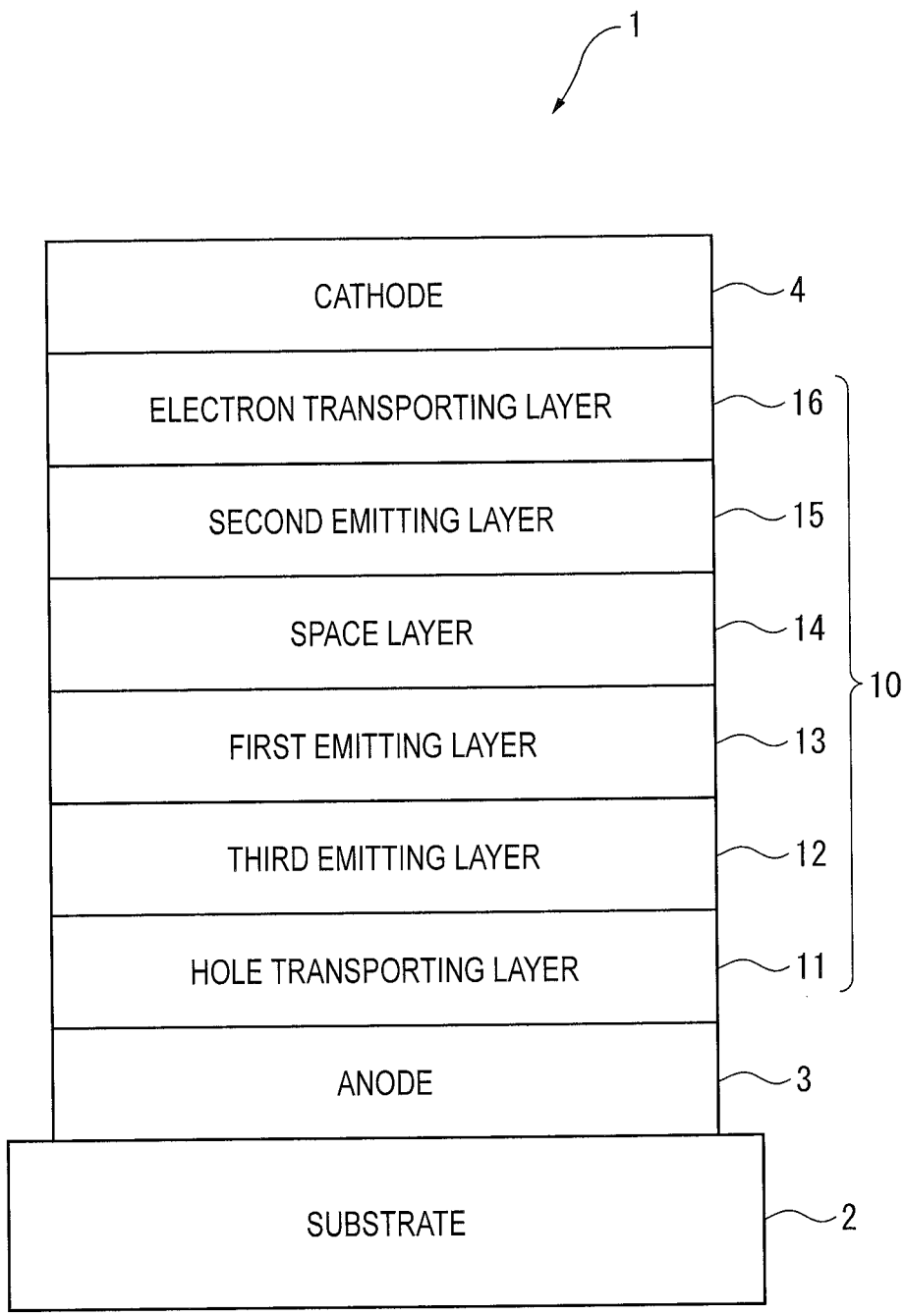
FIG. 1 schematically shows an arrangement of an organic EL device according to a first exemplary embodiment of the invention.

Arrangement(s) of an organic EL device according to an exemplary embodiment will be described below.

The organic EL device according to the exemplary embodiment includes a pair of electrodes and an organic compound layer between the pair of electrodes. The organic compound layer includes a plurality of layers formed of an organic compound. The organic compound layer may include an inorganic compound. The organic compound layer includes a plurality of emitting layers including a first emitting layer and a second emitting layer. The organic compound layer includes a space layer between the first emitting layer and the second emitting layer. The organic compound layer may include a third emitting layer adjacent to the first emitting layer.

In addition, the organic compound layer may include layers applied in a known organic EL device such as a hole injecting layer, a hole transporting layer, an electron injecting layer, an electron transporting layer, a hole blocking layer and an electron blocking layer.

Examples of arrangements of the organic EL device of the invention include:

(a) anode/first emitting layer/space layer/second emitting layer/cathode;

(b) anode/hole injecting•transporting layer/first emitting layer/space layer/second emitting layer/cathode;

(c) anode/first emitting layer/space layer/second emitting layer/electron injecting•transporting layer/cathode;

(d) anode/hole injecting•transporting layer/first emitting layer/space layer/second emitting layer/electron injecting-transporting layer/cathode;

(e) anode/third emitting layer/first emitting layer/space layer/second emitting layer/cathode;

(f) anode/hole injecting•transporting layer/third emitting layer/first emitting layer/space layer/second emitting layer/cathode;

(g) anode/third emitting layer/first emitting layer/space layer/second emitting layer/electron injecting•transporting layer/cathode;

(h) anode/hole injecting•transporting layer/third emitting layer/first emitting layer/space layer/second emitting layer/electron injecting•transporting layer/cathode; and (i) anode/hole injecting•transporting layer/first emitting layer/space layer/second emitting layer/blocking layer/electron injecting•transporting layer/cathode.

Although the arrangements (d) and (h) are preferably used among the above arrangements, the arrangement of the invention is not limited to the above arrangements.

It should be noted that the aforementioned "emitting layer" is an organic layer generally employing a doping system and including a host material and a dopant material. In general, the host material promotes recombination of electrons and holes and transmits exciton energy generated by recombination to the dopant material. The dopant material is preferably a compound having a high quantum yield. The dopant material exhibits a high luminescent performance after receiving exciton energy from the host material.

The "hole injecting-transporting layer" means "at least one of a hole injecting layer and a hole transporting layer" while the "electron injecting-transporting layer" means "at least one of an electron injecting layer and an electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode.

In the invention, the electron transporting layer means an organic layer having the highest electron mobility among organic layer(s) providing an electron transporting zone existing between the emitting layer and the cathode. When the electron transporting zone is provided by a single layer, the single layer is the electron transporting layer. Moreover, in the phosphorescent device, a blocking layer having an electron mobility that is not always high may be provided as shown in the arrangement (i) between the emitting layer and the electron transporting layer in order to prevent diffusion of exciton energy generated in the emitting layer. Thus, the organic layer adjacent to the emitting layer does not always correspond to the electron transporting layer.

FIG. 1 schematically shows an exemplary arrangement of an organic EL device 1 according to the first exemplary embodiment.

The organic EL device 1 includes a light-transmissive substrate 2, an anode 3, a cathode 4 and an organic compound layer 10 interposed between the anode 3 and the cathode 4.

The organic compound layer 10 has a hole transporting layer 11, third emitting layer 12, first emitting layer 13, space layer 14, second emitting layer 15 and electron transporting layer 16 sequentially from the anode 3. The layers are adjacent to each other.

Emitting Layer

The organic EL device according to the exemplary embodiment includes a plurality of emitting layers including the first emitting layer and the second emitting layer.

At least one of the first and second emitting layers contains a phosphorescent dopant material. One of the emitting layers may contain a phosphorescent dopant material while the other of the emitting layers provided via the space layer may contain a fluorescent dopant material. Alternatively, both the emitting layers across the space layer may have a phosphorescent dopant material.

In the exemplary embodiment, one of the emitting layers contains the phosphorescent dopant material and the other of the emitting layers contains the fluorescent dopant material. Thus, the emitting layer containing the phosphorescent dopant material (hereinafter, occasionally referred to as a phosphorescent-emitting layer) is preferably not adjacent to the emitting layer containing the fluorescent dopant material (hereinafter, occasionally referred to as a fluorescent-emitting layer).

In the organic EL device 1, the first emitting layer 13 contains a phosphorescent dopant material and the second emitting layer 15 contains a fluorescent dopant material.

In the organic EL device of the invention, the third emitting layer containing the phosphorescent dopant material is preferably adjacent to the first emitting layer containing the phosphorescent dopant material or the second emitting layer.

In the organic EL device 1, the third emitting layer 12 is adjacent to the first emitting layer 13 containing the phosphorescent dopant material near the anode 3.

Examples of the fluorescent dopant material include a fluoranthene derivative, pyrene derivative, arylacetylene derivative, fluorene derivative, boron complex, perylene derivative, oxadiazole derivative and anthracene derivatives, among which a fluoranthene derivative, pyrene derivative and boron complex are preferable.

The phosphorescent dopant material preferably contains a metal complex. The metal complex preferably contains: a metal atom selected from iridium (Ir), platinum (Pt), osmium (Os), gold (Au), rhenium (Re) and ruthenium (Ru); and a ligand. Particularly, the ligand and the metal atom preferably form an ortho-metal bond.

The phosphorescent dopant material is preferably a compound containing a metal selected from iridium (Ir), osmium (Os) and platinum (Pt) because such a compound exhibits high phosphorescence quantum yield and can further enhance external quantum efficiency of the emitting device. The phosphorescent material is more preferably a metal complex such as an iridium complex, an osmium complex or a platinum complex, among which an iridium complex and a platinum complex are further preferable and ortho metalation of an iridium complex is the most preferable. In terms of the luminous efficiency, an organic metal complex including the ligand selected from phenyl quinoline, phenyl isoquinoline, phenyl pyridine, phenyl pyrimidine, phenyl pyrazine and phenyl imidazole is preferable.

Examples of the phosphorescent dopant material are shown below, but the phosphorescent dopant material is not limited thereto.

[Formula 1]

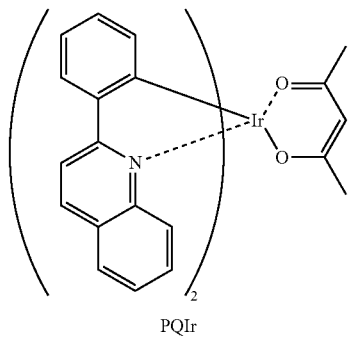

PQIr

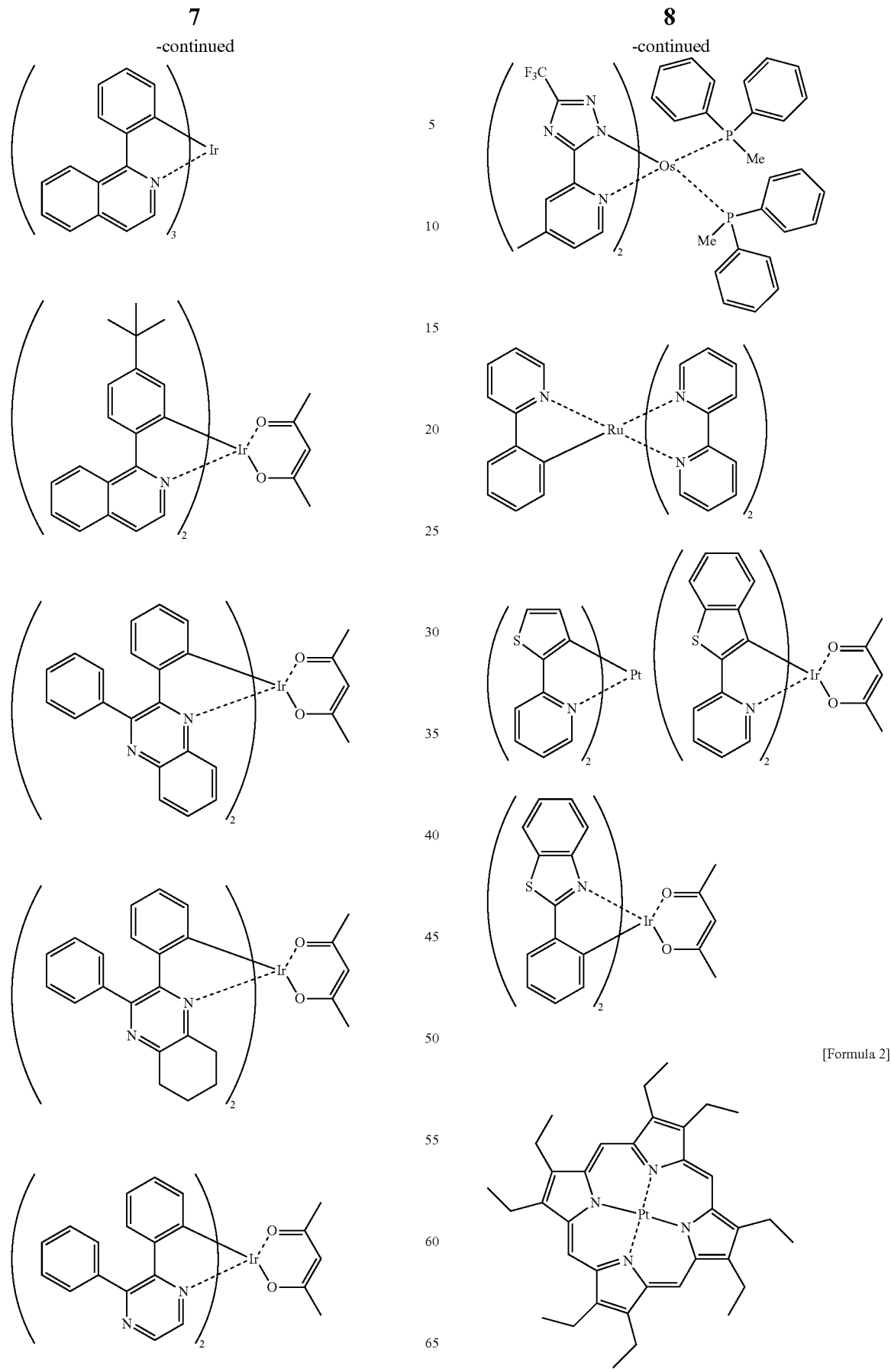

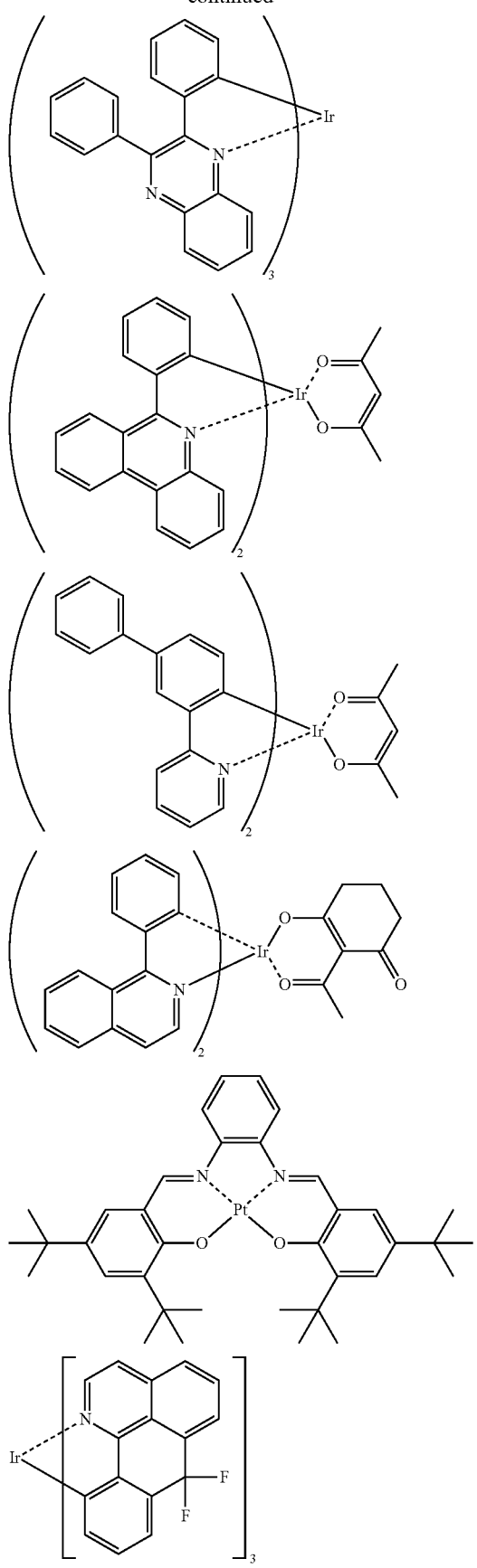
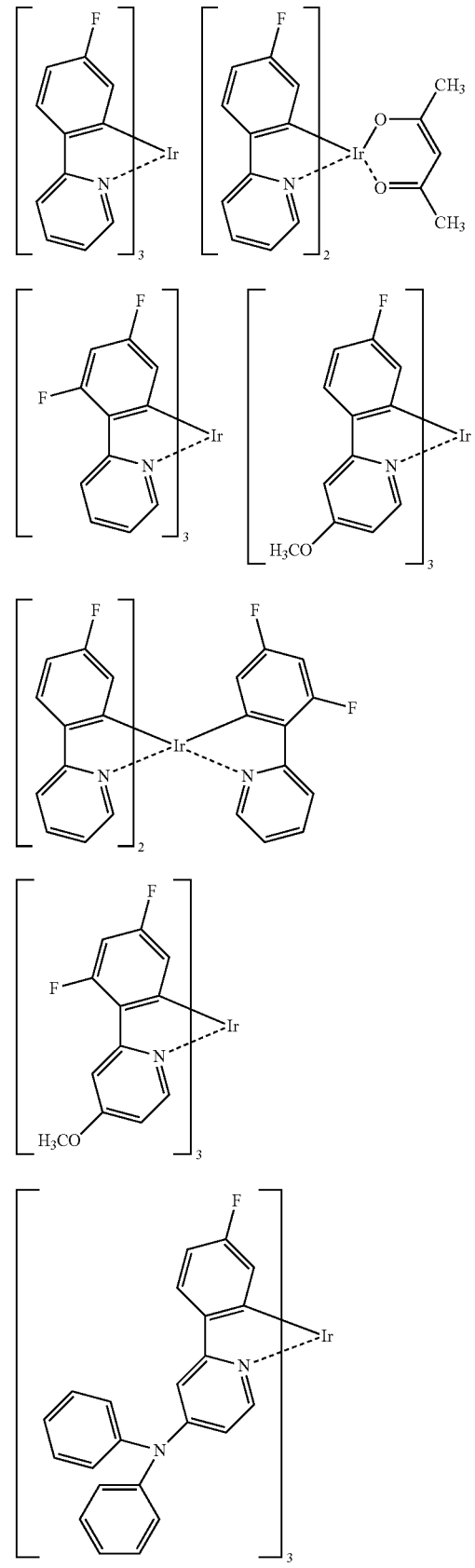

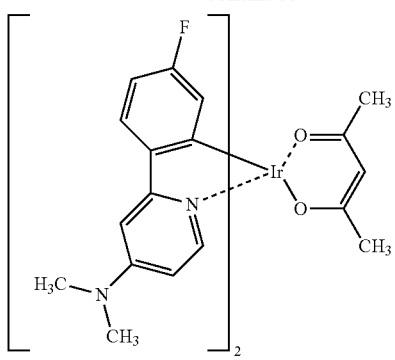
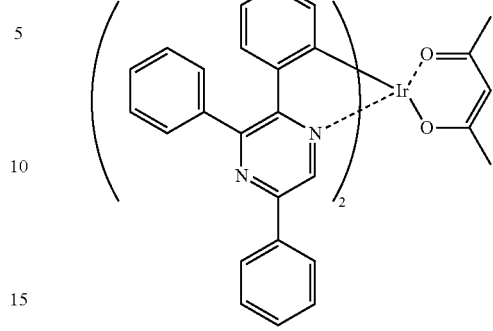
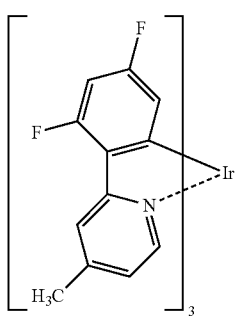
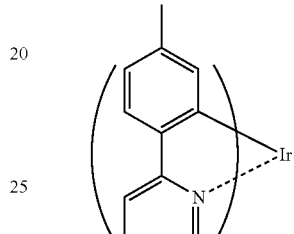
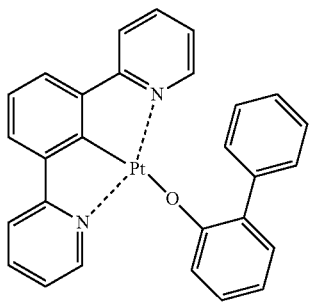
[Formula 4]
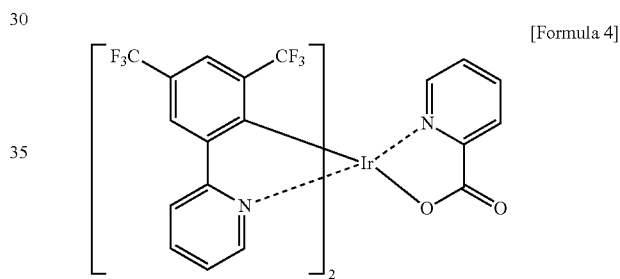
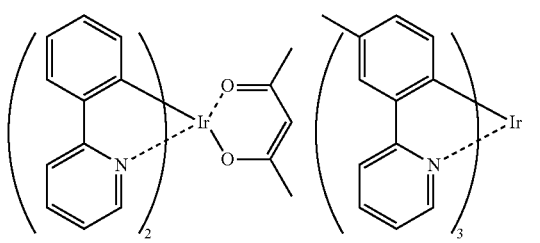
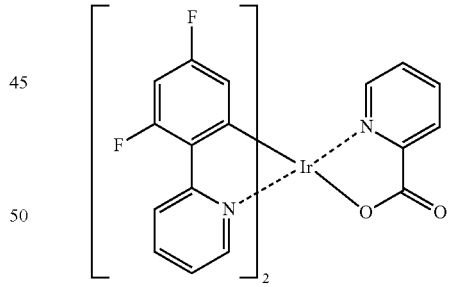
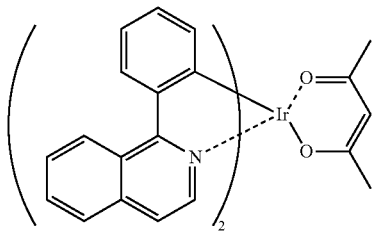
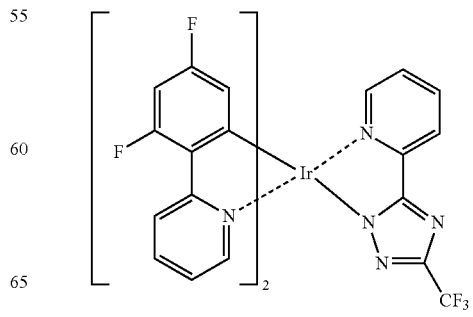

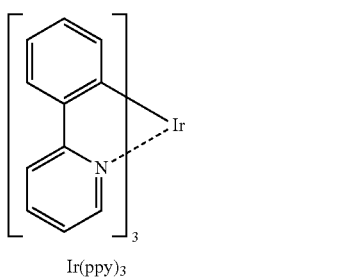

Ir(ppy)₃

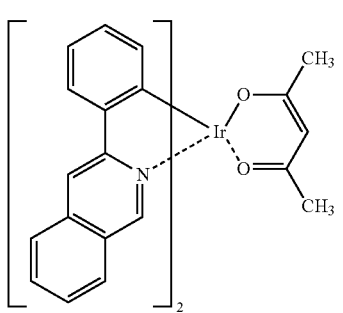

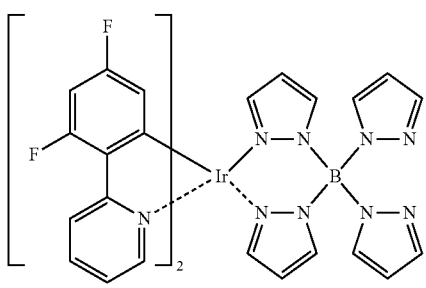

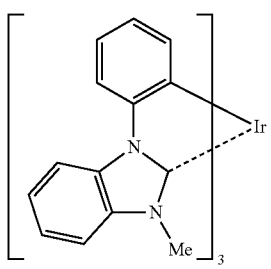

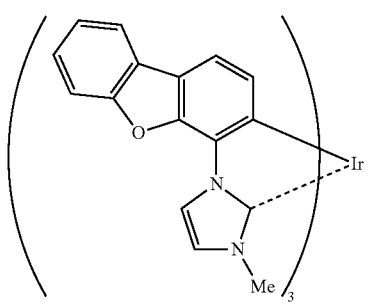

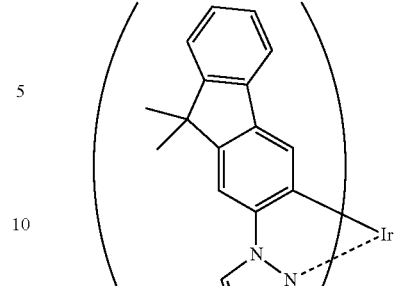

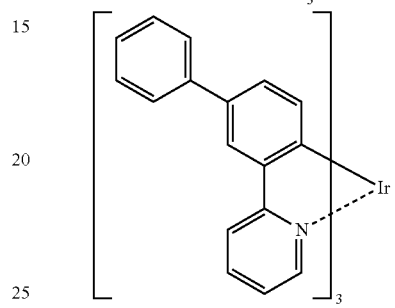

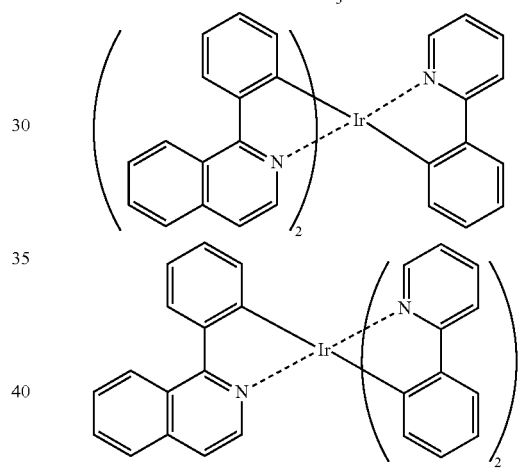

The emitting layer includes a host material in addition to the dopant material.

Herein, in order to differentiate a host material contained in the phosphorescent-emitting layer from a host material contained in the fluorescent-emitting layer, hereinafter, the former is referred to as a phosphorescent host material and the latter is referred to as a fluorescent host material.

It should be noted that a "fluorescent host material" and a "phosphorescent host material" herein respectively mean a host material combined with a fluorescent dopant material and a host material combined with a phosphorescent dopant material, and that a distinction between the "fluorescent host material" and the "phosphorescent host material" is not unambiguously derived only from a molecular structure of the host material in a limited manner.

In other words, the fluorescent host material herein means a material for forming a fluorescent-emitting layer containing a fluorescent dopant material, and does not mean a host material that is only usable as a host material of a fluorescent-emitting material.

Likewise, the phosphorescent host material herein means a material for forming a phosphorescent-emitting layer containing a phosphorescent dopant, and does not mean a host material that is only usable as a host of a phosphorescent-emitting material.

The host material, which is formed of known host materials, is exemplified by an amine derivative, azine derivative, fused polycyclic aromatic derivative and heterocyclic compound.

Examples of the amine derivative include a monoamine compound, diamine compound, triamine compound, tetramine compound and amine compound substituted by a carbazole group.

Examples of the azine derivative are a monoazine derivative, diazine derivative and triazine derivative.

The fused polycyclic aromatic derivative is preferably a fused polycyclic aromatic hydrocarbon having no heterocyclic skeleton. Examples of the fused polycyclic aromatic derivative include the fused polycyclic aromatic hydrocarbon such as naphthalene, anthracene, phenanthrene, chrysene, fluoranthene and triphenylene, or derivatives thereof.

Examples of the heterocyclic compound include a carbazole derivative, dibenzofuran derivative, ladder-type furan compound and pyrimidine derivative.

Specific examples of the phosphorescent host material include a carbazole derivative, triazoles derivative, oxazole derivative, oxadiazole derivative, imidazoles derivative, polyarylalkane derivative, pyrazoline derivative, pyrazolone derivative, phenylenediamine derivative, arylamine derivative, amino-substituted chalcone derivative, styryl anthracene derivative, fluorenone derivative, hydrazone derivative, stilbene derivative, silazane derivative, aromatic tertiary amine compound, styrylamine compound, aromatic dimethylidene compound, porphyrin compound, anthraquinodimethane derivative, anthrone derivative, diphenylquinone derivative, thiopyrandioxide derivative, carbodiimide derivative, fluorenylidenemethan derivative, distyryl pyrazine derivative, heterocyclic tetracarboxylic acid anhydride (e.g., naphthaleneperylene), phthalocyanine derivative, various metal complexes (e.g., a metal complex of 8-quinolinol derivative, and a metal complex having metal phthalocyanine, benzoxazole or benzothiazole as a ligand), polysilane compound, poly(N-vinylcarbazole) derivative, aniline copolymer, conductive high molecular oligomers (e.g., thiophene oligomer and polythiophene), polymer compounds (e.g., a polythiophene derivative, polyphenylene derivative, polyphenylene vinylene derivative and polyfluorene derivative).

The phosphorescent host material of the first emitting layer is preferably selected from compounds having a hole mobility larger than an electron mobility. Use of such a compound as the phosphorescent host material in the first emitting layer facilitates supplying holes to the second emitting layer (fluorescent-emitting layer) via the space layer.

The phosphorescent host material of the third emitting layer is preferably selected from compounds having a hole mobility larger than an electron mobility. Use of such a compound as the phosphorescent host material in the third emitting layer facilitates supplying holes to the second emitting layer (fluorescent-emitting layer) via the first emitting layer and the space layer. In this arrangement, it is more preferable to use a compound having a hole mobility larger than an electron mobility as the phosphorescent host material of the first emitting layer adjacent to the third emitting layer, which further facilitates supplying holes to the second emitting layer (fluorescent-emitting layer).

A thickness of the emitting layer is preferably in a range of 1 nm to 50 nm, more preferably in a range of 5 nm to 50 nm and most preferably in a range of 10 nm to 50 nm. The thickness of less than 1 nm may cause difficulty in forming the emitting layer and in controlling chromaticity, while the thickness of more than 50 nm may raise drive voltage.

In the emitting layer, a ratio of the host material and the dopant material is preferably in a range of 99:1 to 50:50 at a mass ratio.

Space Layer

In this exemplary embodiment, a compound satisfying specific conditions is used in the space layer as described above. The specific conditions will be described in [1] to [3] below.

[1] $\Delta ST$

The inventors have found that a luminous efficiency and a color rendering property of an organic EL device are improved by using a compound having a small energy gap ($\Delta ST$) between singlet energy EgS and triplet energy EgT as a material to be contained in the space layer (hereinafter, referred to as a space layer material).

From quantum chemical viewpoint, decrease in the energy difference ($\Delta ST$) between the singlet energy EgS and the triplet energy EgT can be achieved by a small exchange interaction therebetween. Physical details of the relationship between $\Delta ST$ and the exchange interaction are exemplarily described in the following:

Document 1: Organic EL Symposium, proceeding for the tenth meeting edited by Chihaya Adachi et al., S2-5, pp 11-12; and Document 2: Organic Photochemical Reaction Theory edited by Katsumi Tokumaru, Tokyo Kagaku Dojin Co., Ltd. (1973).

Such a material can be synthesized according to molecular design based on quantum calculation. Specifically, the material is a compound in which a LUMO electron orbit and a HOMO electron orbit are localized to avoid overlapping.

When $\Delta ST$ becomes small, a value of affinity (Af) of the space layer material becomes large. Consequently, an energy gap between the first emitting layer and the second emitting layer which are adjacent to the space layer material becomes small, thereby facilitating injecting electrons from the emitting layer located near the cathode to the emitting layer located near the anode via the space layer to decrease the drive voltage of the organic EL device.

Figure 2:
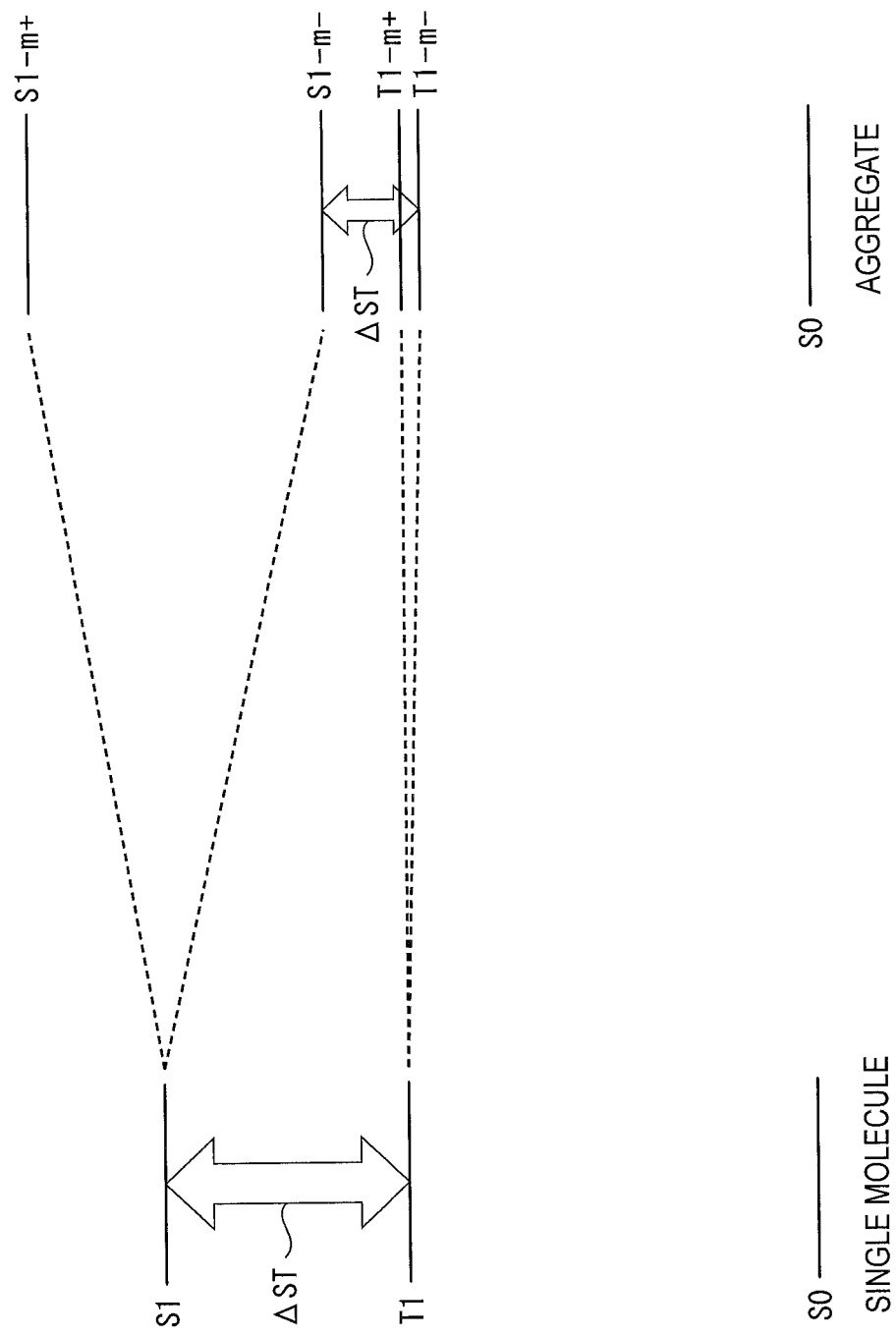
FIG. 2 shows an example of physics models with aggregate formation.

Decrease in the energy gap ($\Delta ST$) between the singlet energy EgS and the triplet energy EgT can also be achieved by aggregate formation. Herein, the aggregate does not reflect an electronic state by a single molecule, but the aggregate is provided by several molecules physically approaching each other. After the plurality of molecules approach each other, electronic states of a plurality of molecules are mixed and changed, thereby changing an energy level. A value of singlet energy is decreased, thereby decreasing a value of $\Delta ST$. The decrease in the value of $\Delta ST$ by the aggregate formation can also be explained by Davydov splitting model showing that two molecules approach each other to change electronic states thereof (see FIG. 2). As shown in Davydov splitting model, it is considered that change of the electronic states by two molecules different from change of an electronic state by a single molecule is brought about by two molecules physically approaching each other. A singlet state exists in two states represented by $S1-m^+$ and $S1-m^-$. A triplet state exists in two states represented by $T1-m^+$ and $T1-m^-$. Since $S1-m^-$ and $T1-m^-$ showing a lower energy level exist, $\Delta ST$ representing a gap between $S1-m^-$ and $T1-m^-$ becomes smaller than that in the electronic state by a single molecule.

The Davydov splitting model is exemplarily described in the following:

Document 3: J. Kang, et al, International Journal of Polymer Science, Volume 2010, Article ID 264781;

Document 4: M. Kasha, et al, Pure and Applied Chemistry, Vol. 11, p 371, 1965; and Document 5: S. Das, et al, J. Phys. Chem. B. vol. 103, pp 209, 1999.

It should be noted that the aggregate according to the exemplary embodiment means that a single molecule forms any aggregate with another single molecule. In other words, a specific aggregate state is not shown in the exemplary embodiment. An aggregate state of an organic molecule is probably formable in various states in a thin film, which is different from an aggregate state of an inorganic molecule.

In this exemplary embodiment, a compound having a small ΔST and easily forming an aggregate is used. The aforementioned triplet energy EgT is different from a typically defined triplet energy. Such a difference will be described below.

For general measurement of the triplet energy, a target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

Herein, the compound used for the space layer material in the exemplary embodiment has a small ΔST as described above. When ΔST is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish emission from the singlet state from emission from the triplet state, the value of the triplet energy is basically considered dominant.

Accordingly, in order to distinguish the triplet energy EgT in the exemplary embodiment from the typical triplet energy EgT in a strict meaning although the measurement method is the same, the triplet energy EgT in the exemplary embodiment is defined as follows. A target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. Energy is calculated as an energy gap $Eg_{77K}$ by a predetermined conversion equation based on a wavelength value at an intersection of the tangent and the abscissa axis. ΔST is defined as a difference between the singlet energy EgS and the energy gap $Eg_{77K}$.

The triplet energy measured in a solution state may include an error by interaction between the target molecule and the solvent. Accordingly, as an ideal condition, a measurement in a thin film state is desired in order to avoid the interaction between the target molecule and the solvent. However, the molecule of the compound used in this exemplary embodiment as the space layer material exhibits a photoluminescence spectrum having a broad half bandwidth in a solution state, which strongly implies aggregate formation also in the solution state. For this reason, a measurement value of the triplet energy in the solution state is used in this exemplary embodiment.

The singlet energy EgS in the exemplary embodiment is defined based on calculation by a typical method. Specifically, the target compound is evaporated on a quartz substrate to prepare a sample. An absorption spectrum (ordinate axis: absorbance, abscissa axis: wavelength) of the sample is measured at a normal temperature (300K). A tangent is drawn to the rise of the absorption spectrum on the long-wavelength side. The singlet energy EgS is calculated by a predetermined conversion equation based on the tangent and the wavelength value at the intersection.

The calculation of the singlet energy EgS and the energy gap $Eg_{77K}$ will be described in detail later.

[2] Half Bandwidth

In addition to the conditions on the ΔST, the inventors have found that the luminous efficiency and the color rendering property of the organic EL device is improved by using a compound having a predetermined value of a half bandwidth of a photoluminescence spectrum as the space layer material.

In the course of reaching the invention, the inventors found that improvement in the luminous efficiency of the organic EL device obtained using a compound having a large half bandwidth of a photoluminescence spectrum as the space layer material is attributed to easy aggregate-formability of the compound having the large half bandwidth of the photoluminescence spectrum in a solution state. A relationship between half bandwidth of the photoluminescence spectrum and easy aggregate-formability is estimated as follows.

In a compound having a property of typically existing as a single molecule without forming an aggregate, a vibrational level is less recognized in the singlet state, so that a narrow half bandwidth of the photoluminescence spectrum is observed. For instance, CBP exhibits a property to typically exist as a single molecule, in which a half bandwidth of a photoluminescence spectrum is relatively narrow as much as about 50 nm.

On the other hand, in the compound easily forming the aggregate, a plurality of molecules electronically influence each other, whereby a lot of vibrational levels exist in the singlet state. As a result, since the vibrational levels of the singlet state are often relaxed to the ground state, the half bandwidth of the photoluminescence spectrum is increased.

As described above, when the compound used as the space layer material is a compound having a half bandwidth of a photoluminescence spectrum in a range of 80 nm to 300 nm, the compound easily forms an aggregate also in a film of the space layer. Such an aggregate formation decreases ΔST. When ΔST is decreased, as described in the above [1], carriers are easily injected to the first and second emitting layers which are adjacent to the space layer, thereby improving a luminous efficiency and a color rendering property of the organic EL device.

[3] Δn

In addition to the conditions on the ΔST, the inventors have found that the luminous efficiency and the color rendering property of the organic EL device are improved by using, as the space layer material, a compound having a predetermined value of a difference Δn between a refractive index $n_Z$ in a direction perpendicular to a silicon substrate surface and a refractive index $n_X$ in a direction parallel to the silicon substrate surface in a spectroscopic ellipsometry method.

Herein, Δn is a value representing a difference between the refractive index $n_Z$ in the direction perpendicular to the silicon substrate surface and the refractive index $n_X$ in the direction parallel to the silicon substrate surface in a region of 0.001 or less of an extinction coefficient in the spectroscopic ellipsometry measurement (measurement range: 200 nm to 1000 nm). Specifically, the measurement range of the wavelength by the spectroscopic ellipsometry measurement is preferably in a range of 600 nm to 800 nm. Herein, Δn is defined as a value at a wavelength of 700 nm.

The inventors have found that one way to reduce ΔST is to use the compound forming the aggregate and that the compound having a large Δn easily forms the aggregate in a film of the compound. A relationship between Δn and easy formability of the aggregate is estimated as follows.

When a large difference is generated between a refractive index n in a vertical direction z relative to the silicon substrate and a refractive index n in a parallel direction x relative to the silicon substrate, it is considered that molecules exist with a certain regularity in a thin film state. In other words, the compound used as the space layer material in the exemplary embodiment is expected to have a predetermined value of Δn while forming the aggregate in the thin film state to exhibit a certain regularity.

On the other hand, a compound having an extremely small Δn (e.g., CBP and Alq$_3$) exists in an amorphous state in which molecules have no regularity in a thin film state.

The relationship between Δn and easy formability of the aggregate is described in the following:

Document 6: D. Yokoyama et al., Org. Electron. 10, 127-137 (2009);

Document 7: D. Yokoyama et al., Appl. Phys. Lett. 93, 173302 (2008); and

Document 8: D. Yokoyama et al., Appl. Phys. Lett. 95, 243303 (2009).

As defined in the above numerical formula (2), the compound having Δn larger than 0.04 and smaller than 1.0 easily forms an aggregate in a film to decrease ΔST by such an aggregate formation. A compound having Δn larger than 0.07 forms an aggregate more easily. A compound having Δn larger than 0.2 forms an aggregate further easily. When ΔST is decreased, carriers are easily injected to the first and second emitting layers which are adjacent to the space layer, thereby improving a luminous efficiency and a color rendering property of the organic EL device.

The compound used in the space layer is preferably a compound having a predetermined value or more of at least one of the singlet energy EgS and the triplet energy $Eg_{77K}$ in addition to the above conditions on ΔST.

Next, EgS and EgT will be described.

Figure 3:
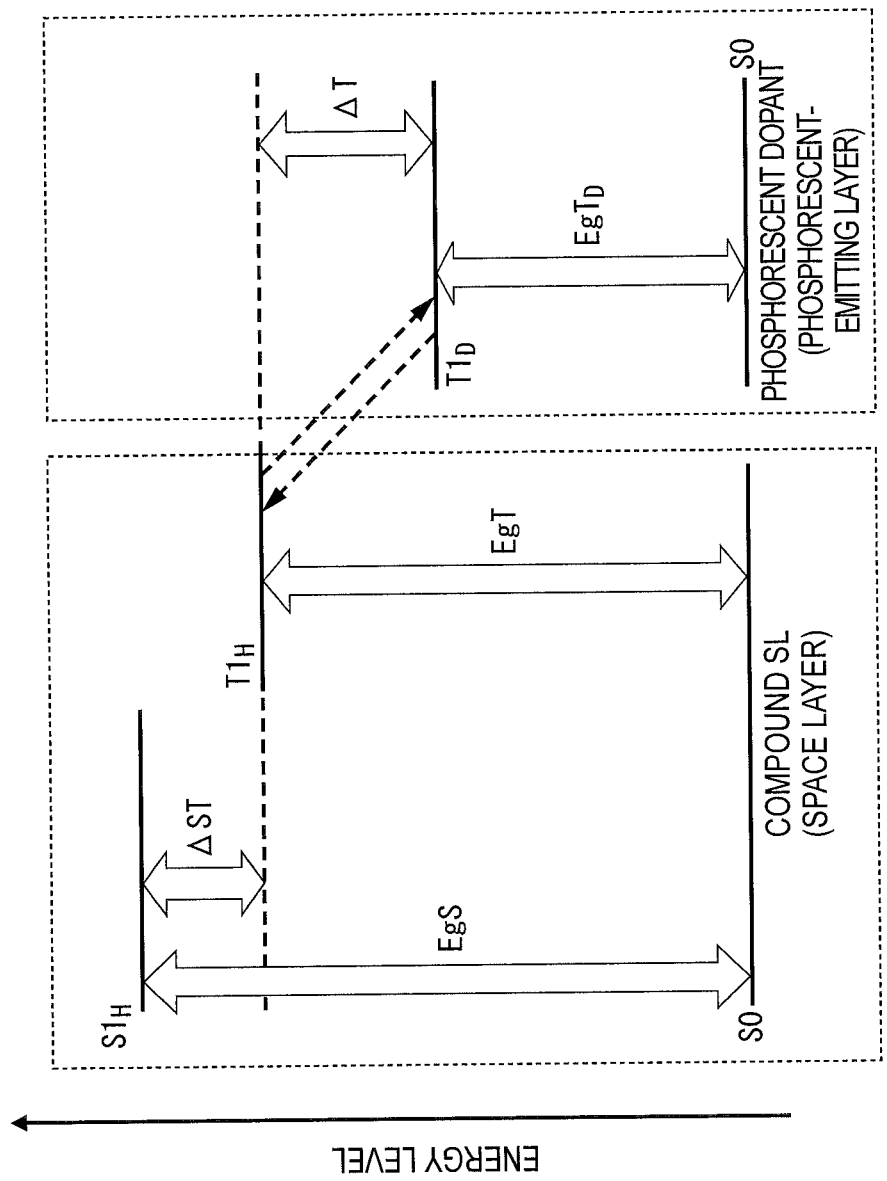
FIG. 3 shows a relationship between energy levels of a host material and a dopant material in an emitting layer.

FIG. 3 shows a relationship in energy levels between the space layer and the phosphorescent-emitting layer. Herein, the phosphorescent-emitting layer is one of the first emitting layer and second emitting layer adjacent to the space layer, which contains a phosphorescent dopant material.

In FIG. 3, S0 represents a ground state, $S1_H$ represents a lowest singlet state of the compound used as the space layer material (the compound is referred to as a compound SL for convenience in the explanation of FIG. 3), $T1_H$ represents a lowest triplet state of the compound SL, and $T1_D$ represents a lowest triplet state of the phosphorescent dopant material contained in the phosphorescent-emitting layer adjacent to the space layer.

As shown in FIG. 3, a difference between $S1_H$ and $T1_H$ corresponds to ΔST and a difference between $T1_H$ and $T1_D$ corresponds to ΔT. A dotted-line arrow shows energy transfer between the respective excited states in FIG. 3.

As described above, a compound having a small ΔST is selected for the space layer material in the exemplary embodiment. In view of the Davydov splitting model shown above as an example, such an aggregate formation causes an excited level to be split. Accordingly, an excited state of T1-m$^-$ showing a low energy level also exists. Accordingly, an energy gap between the lowest triplet state $T1_D$ of the compound SL and the lowest triplet state $T1_D$ of the phosphorescent dopant material is decreased, which may cause triplet excitons to transfer from the phosphorescent dopant material to the other emitting layer (fluorescent-emitting layer) opposite to the phosphorescent-emitting layer through the space layer therebetween, so that the phosphorescent-emitting layer may not emit. In other words, a compound capable of easily forming an aggregate in an organic thin film layer may occasionally trap triplet excitons of the dopant material at a high probability according to calculation when the compound is formed of a single molecule.

Even with this arrangement, when the compound capable of easily forming the aggregate is used as the space layer material, the energy level of the lowest triplet state of the space layer is actually decreased due to the aggregate formation, so that the triplet excitons of the dopant material may be unable to be sufficiently trapped.

Accordingly, the compound used as the space layer material in the exemplary embodiment is preferably selected from a compound having a predetermined value or more of the singlet energy EgS or the triplet energy $Eg_{77K}$ in addition to the above conditions on ΔST, Δn or the half bandwidth. Reduction of the efficiency of trapping the triplet excitons is prevented by using such a compound.

It is preferable that a difference ΔT between the triplet energy $EgT_D$ of the phosphorescent dopant material and the energy gap $Eg_{77K}$ of the space layer material satisfies the following numerical formula (5).

[Numerical Formula 5]

$$\Delta T = Eg_{77K} - EgT_D > 0.1 \text{ [eV]} \quad (5)$$

When ΔT is larger than 0.1 eV as shown by the numerical formula (5), the efficiency of trapping the triplet excitons is improved. ΔT larger than 0.2 eV is more preferable.

When two or more phosphorescent dopant materials are contained in the phosphorescent-emitting layer, $EgT_D$ of each of the dopant materials preferably satisfies the relationship of the numerical formula (5).

The compound used in the space layer in the exemplary embodiment is not limited to a compound in which all molecules form an aggregate in the film of the space layer. For instance, some molecules may exist singularly without forming an aggregate. In other words, aggregates and non-aggregates may exist together in the film of the space layer.

As long as the compound has a small ΔST even when forming no aggregate in the space layer, the compound is usable as the space layer material in the exemplary embodiment.

The compound used as the space layer material preferably has at least one of skeletons represented by the following formulae (1) to (8).

[Formula 5]

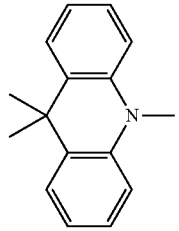

(1)

-continued
(2)
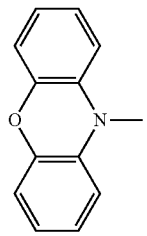
(3)
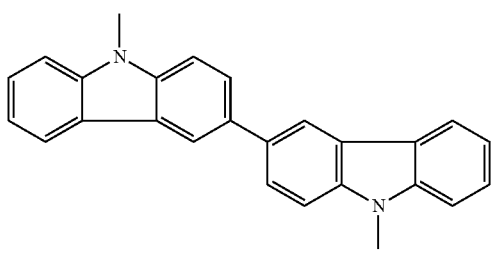
(4)
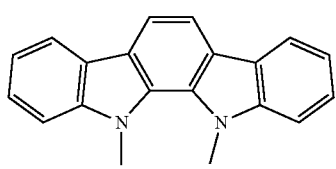
(5)
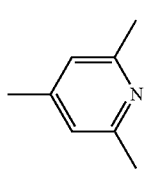
(6)
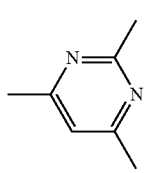
(7)
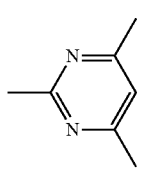
(8)
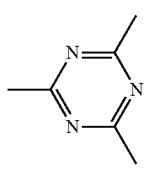
[Formula 6]
SL-1
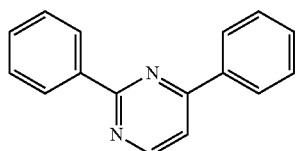
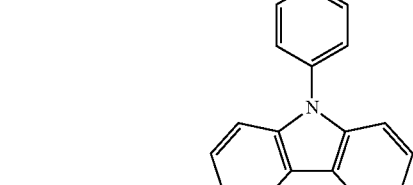
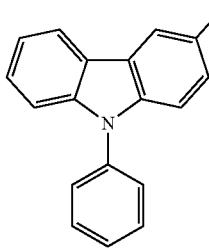
SL-2
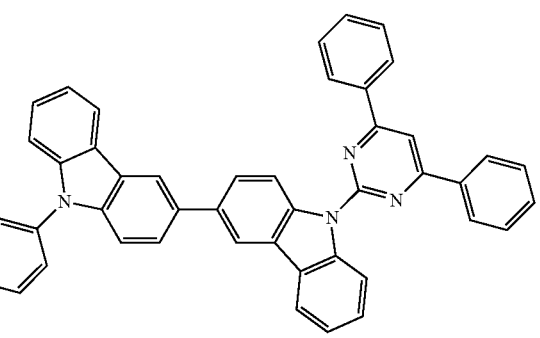
SL-3
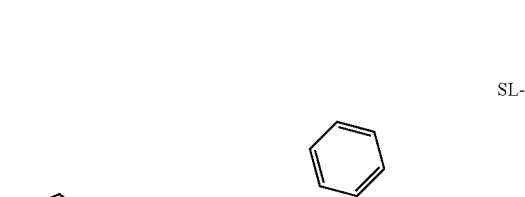
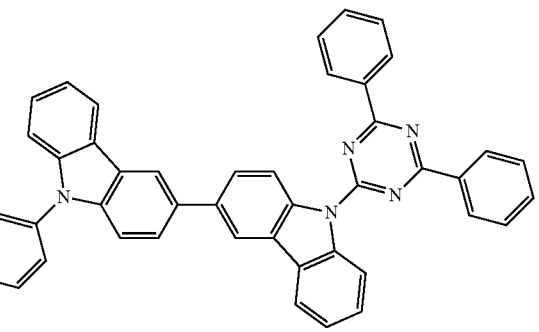
Examples of the compound used in the space layer in the exemplary embodiment are shown below. However, the compound is not limited thereto.

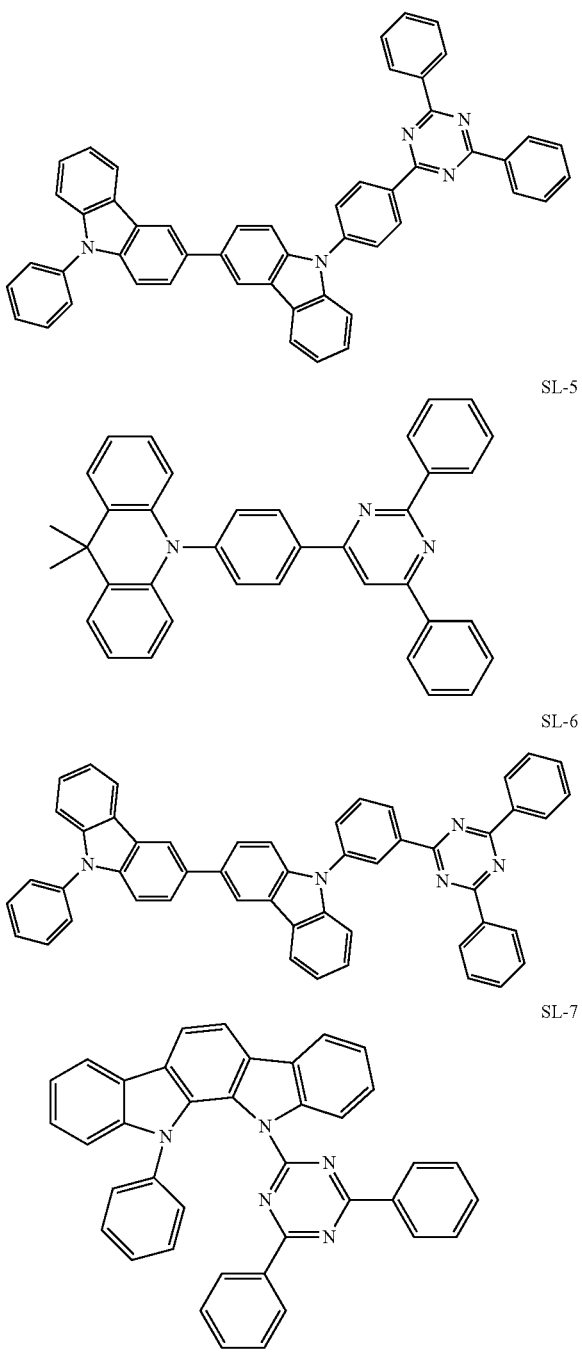

The space layer in the exemplary embodiment is formable of a single material using the above compound. In other words, the space layer may not be formed of a mixture material of an electron transporting compound and a hole transporting compound. However, the space layer may be formed by mixing a plurality of the compounds used as the space layer material in the exemplary embodiment. As long as the function of the space layer in the exemplary embodiment is not hampered, other compounds may be added.

In the exemplary embodiment, a thickness of the space layer is preferably in a range of 1 nm to 20 nm.

For white emission of the organic EL device, an arrangement of the emitting layer and the space layer is preferably exemplified by the following arrangements (E1) to (E7):

(E1) red phosphorescent-emitting layer/green phosphorescent-emitting layer/space layer/blue fluorescent-emitting layer;

(E2) green phosphorescent-emitting layer/red phosphorescent-emitting layer/space layer/blue fluorescent-emitting layer;

(E3) green•red phosphorescent-emitting layer/space layer/blue fluorescent-emitting layer;

(E4) red phosphorescent-emitting layer/space layer/green fluorescent-emitting layer/blue fluorescent-emitting layer;

(E5) red phosphorescent-emitting layer/space layer/blue fluorescent-emitting layer/green fluorescent-emitting layer/

(E6) green phosphorescent-emitting layer/space layer/red fluorescent-emitting layer/blue fluorescent-emitting layer; and (E7) green phosphorescent-emitting layer/space layer/blue fluorescent-emitting layer/red fluorescent-emitting layer.

Moreover, the organic EL device may have more than one space layers. An additional space layer may be formed between the adjacent emitting layers. For instance, the arrangement (E1) may be altered to the following:

(E8) red phosphorescent-emitting layer/space layer/green phosphorescent-emitting layer/space layer/blue fluorescent-emitting layer.

The organic EL device 1 is formed in the arrangement (E1). With this arrangement, the first emitting layer 13 is a green phosphorescent-emitting layer, the second emitting layer 15 is a blue fluorescent-emitting layer, and the third emitting layer 12 is a red phosphorescent-emitting layer. The first emitting layer 13 and the third emitting layer 12 are located closer to the anode 3 than the space layer. The second emitting layer 15 is closer to the cathode 4 than the space layer 14.

In a white-emitting organic EL device having the space layer, triplet energy in the space layer needs to be higher than that in the blue fluorescent-emitting layer of the second emitting layer 15. This is because a compound contained in the blue fluorescent-emitting layer generally has a small triplet energy and, when the blue fluorescent-emitting layer is brought into contact with the green phosphorescent-emitting layer of the first emitting layer 13, the triplet energy is transferred from the phosphorescent-emitting layer to the fluorescent-emitting layer, resulting in reduction of the luminous efficiency. Herein, a compound having a large triplet energy has a large singlet energy EgS.

Accordingly, when such a compound having a large triplet energy is used in the space layer, a difference in affinity between the space layer and the second emitting layer (fluorescent-emitting layer) becomes large to cause electrons to be less likely to be injected from the second emitting layer 15 near the cathode 4 to the first emitting layer 13, resulting in no improvement in the luminous efficiency of the organic EL device.

However, since the aforementioned compound satisfying the specific conditions is used in the space layer of the organic EL device 1, the singlet energy EgS becomes small to cause electrons to be likely to be injected from the second emitting layer 15 to the first emitting layer 13, resulting in improvement in the luminous efficiency of the organic EL device.

Substrate

The organic EL device according to the exemplary embodiment is formed on a light-transmissive substrate. The light-transmissive substrate supports the anode, organic compound layer, cathode and the like of the organic EL device. The light-transmissive substrate is preferably a smoothly-shaped substrate that transmits 50% or more of light in a visible region of 400 nm to 700 nm.

The light-transmissive plate is exemplarily a glass plate, a polymer plate or the like.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or higher.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/sq. or lower. The thickness of the anode is typically in the range of 10 nm to 1 µm, and preferably in the range of 10 nm to 200 nm, though it depends on the material of the anode.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω/sq. or lower.

The thickness of the cathode is typically in the range of 10 nm to 1 µm, and preferably in the range of 50 nm to 200 nm, though it depends on the material of the cathode.

Hole Injecting•Transporting Layer

The hole injection/transport layer helps injection of holes to the emitting layer and transport the holes to an emitting region. A compound having a large hole mobility and a small ionization energy is used as the hole injection/transport layer.

A material for forming the hole injection/transport layer is preferably a material of transporting the holes to the emitting layer at a lower electric field intensity. For instance, an aromatic amine compound is preferably used.

Electron Injecting•Transporting Layer

The electron injecting•transporting layer helps injection of the electrons into the emitting layer and transports the electrons to an emitting region. A compound having a large electron mobility is used as the electron injecting•transporting layer.

A preferable example of the compound used as the electron injecting•transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

In the organic EL device in the exemplary embodiment, in addition to the above exemplary compound, any compound selected from compounds known as being used in the typical organic El device is usable as a compound for the organic compound layer other than the emitting layer.

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink jet are applicable.

The thickness of each organic layer of the organic EL device in the exemplary embodiment is subject to no limitation except for the thickness particularly described above. However, the thickness is typically preferably in a range of several nanometers to 1 µm because an excessively thin film is likely to entail defects such as a pin hole while an excessively thick film requires high applied voltage and deteriorates efficiency.

Second Exemplary Embodiment

Next, an organic EL device 20 according to a second exemplary embodiment of the invention will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

Figure 4:
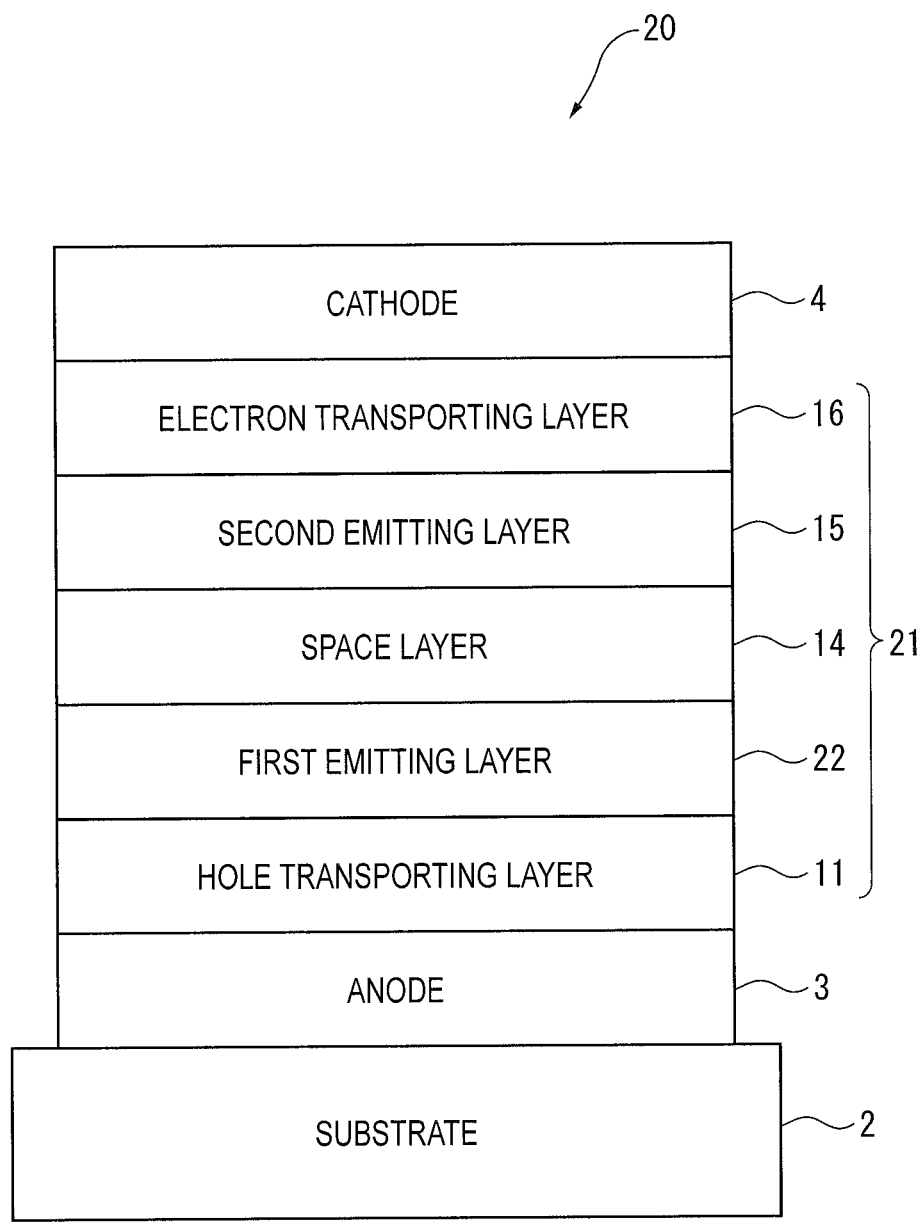
FIG. 4 schematically shows an arrangement of an organic EL device according to a second exemplary embodiment of the invention.

FIG. 4 shows a schematic arrangement of the organic EL device 20.

An organic compound layer 21 of the organic EL device 20 is different in the arrangement from the organic compound layer 10 of the organic EL device 1 of the first exemplary embodiment. Specifically, in the organic EL device 20, no third emitting layer is provided and a first emitting layer 22 includes a green phosphorescent dopant material, a red phosphorescent dopant material and a phosphorescent host material. In other words, the emitting layer and the space layer of the organic EL device 20 is in the arrangement (E3) of "green-red phosphorescent-emitting layer/space layer/blue fluorescent-emitting layer." The arrangement of the rest of the organic EL device 20 is the same as that of the organic EL device 1. The compounds and the layer arrangements described in the first exemplary embodiment may be included in the second exemplary embodiment.

The first emitting layer 22 of the organic EL device 20 is preferably formed by co-evaporation.

The organic EL device 20 also provides the same advantages as those of the organic EL device 1.

Third Exemplary Embodiment

Next, an organic EL device 30 according to a third exemplary embodiment of the invention will be described below. In the description of the third exemplary embodiment, the same components as those in the first exemplary embodiment are denoted by the same reference signs and names to simplify or omit an explanation of the components. In the third exemplary embodiment, the same materials and compounds as described in the first exemplary embodiment are usable.

Figure 5:
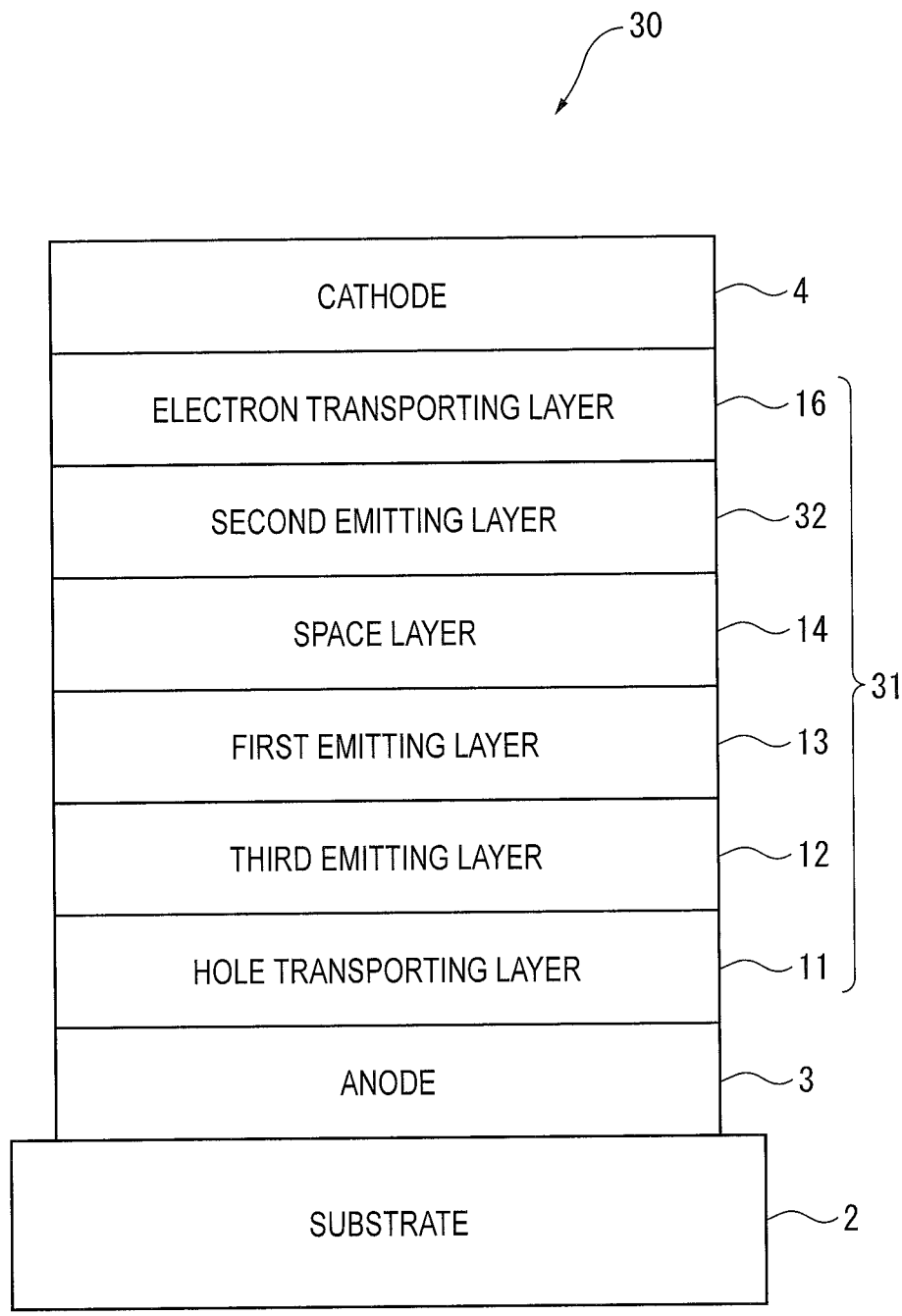
FIG. 5 schematically shows an arrangement of an organic EL device according to a third exemplary embodiment of the invention.

FIG. 5 shows a schematic arrangement of the organic EL device 30.

An organic compound layer 31 of the organic EL device 30 is different in the arrangement from the organic compound layer 10 of the organic EL device 1 of the first exemplary embodiment. Specifically, the second emitting layer 15 of the organic EL device 1 is a fluorescent-emitting layer whereas a second emitting layer 32 of the organic EL device 30 is a phosphorescent-emitting layer. In other words, the organic EL device 30 includes the first emitting layer 13 and the second emitting layer 32 (phosphorescent-emitting layers) laminated through the space layer 14.

In the arrangement of the organic El device in which the phosphorescent-emitting layers are laminated through the space layer as in the exemplary embodiment, for white emission of the organic EL device, an arrangement of the emitting layer and the space layer is preferably exemplified by the following arrangements (P1) to (P7):

(P1) red phosphorescent-emitting layer/green phosphorescent-emitting layer/space layer/blue phosphorescent-emitting layer;

(P2) green phosphorescent-emitting layer/red phosphorescent-emitting layer/space layer/blue phosphorescent-emitting layer;

(P3) green•red phosphorescent-emitting layer/space layer/blue phosphorescent-emitting layer;

(P4) red phosphorescent-emitting layer/space layer/green phosphorescent-emitting layer/blue phosphorescent-emitting layer;

(P5) red phosphorescent-emitting layer/space layer/blue phosphorescent-emitting layer/green phosphorescent-emitting layer;

(P6) green phosphorescent-emitting layer/space layer/red phosphorescent-emitting layer/blue phosphorescent-emitting layer; and (P7) green phosphorescent-emitting layer/space layer/blue phosphorescent-emitting layer/red phosphorescent-emitting layer.

Moreover, the organic EL device may have more than one space layers. An additional space layer may be formed between the adjacent emitting layers. For instance, the arrangement (P1) may be altered to the following arrangements (P8) and (P9):

(P8) red phosphorescent-emitting layer/space layer/green phosphorescent-emitting layer/space layer/blue phosphorescent-emitting layer; and (P9) red phosphorescent-emitting layer/space layer/green phosphorescent-emitting layer/space layer/blue fluorescent-emitting layer.

The emitting layer and the space layer of the organic EL device 30 are formed in the arrangement (P1). The rest in the arrangement is the same in the organic EL device 30 and the organic EL device 1. The compounds and the layer arrangements described in the first exemplary embodiment may be included in the third exemplary embodiment.

The organic EL device 30 also provides the same advantages as the organic EL device 1.

Fourth Exemplary Embodiment

Next, an organic EL device 40 according to a fourth exemplary embodiment of the invention will be described below. In the description of the fourth exemplary embodiment, the same components as those in the first to third exemplary embodiments are denoted by the same reference signs and names to simplify or omit an explanation of the components. In the fourth exemplary embodiment, the same materials and compounds as described in the first exemplary embodiment are usable.

Figure 6:
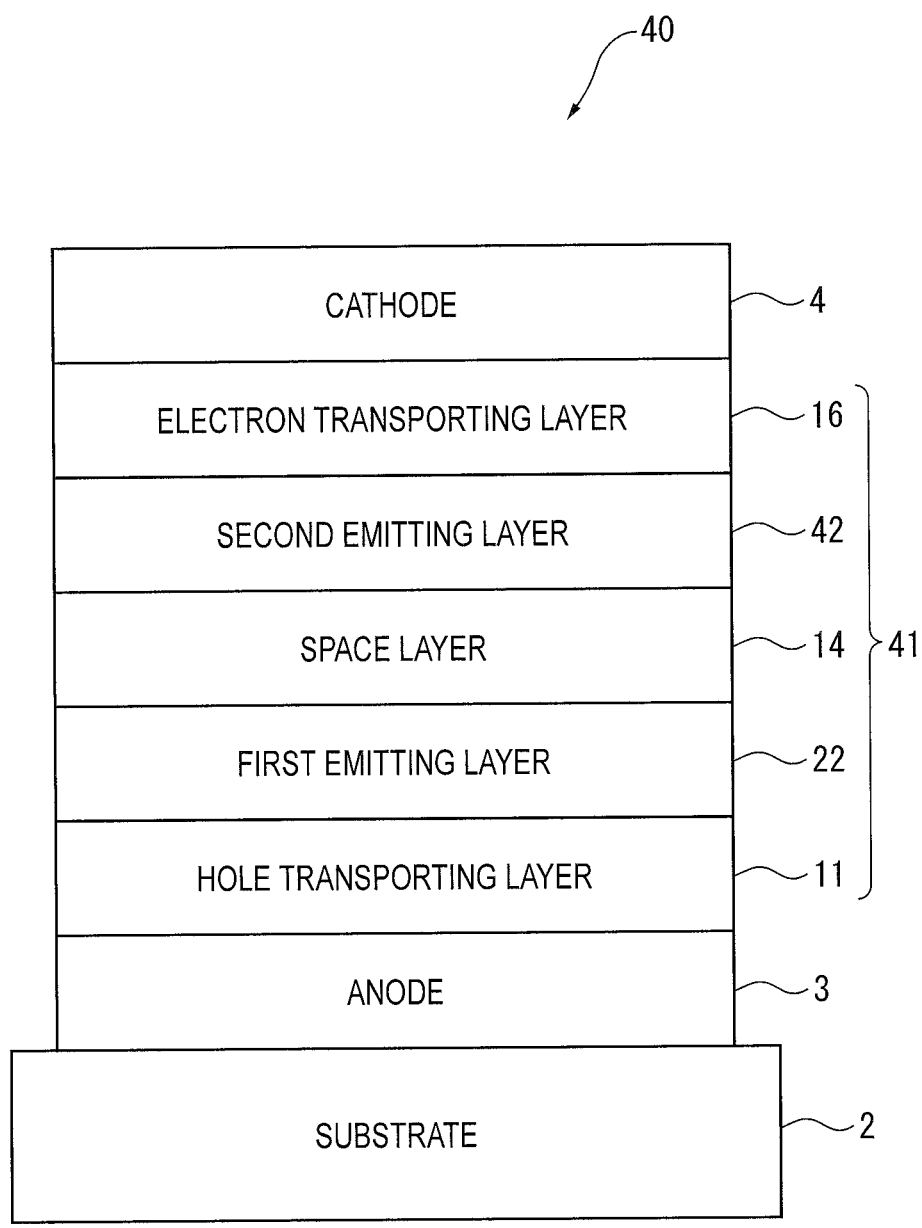
FIG. 6 schematically shows an arrangement of an organic EL device according to a fourth exemplary embodiment of the invention.

FIG. 6 shows a schematic arrangement of the organic EL device 40.

An organic compound layer 41 of the organic EL device 40 is different in the arrangement from the organic compound layer 21 of the organic EL device 20 of the second exemplary embodiment. Specifically, the second emitting layer 15 of the organic EL device 20 is a fluorescent-emitting layer whereas a second emitting layer 42 of the organic EL device 40 is a phosphorescent-emitting layer. In other words, the organic EL device 40 includes the first emitting layer 22 and the second emitting layer 42 (phosphorescent-emitting layers) laminated through the space layer 14.

The emitting layer and the space layer of the organic EL device 40 are formed in the arrangement (P3). The arrangement of the rest of the organic EL device 40 is the same as that of the organic EL device 1 (20). The compounds and the layer arrangements described in the first exemplary embodiment may be included in the fourth exemplary embodiment.

The first emitting layer 22 and the second emitting layer 42 of the organic EL device 40 are preferably formed by co-evaporation.

The organic EL device 40 also provides the same advantages as those of the organic EL device 1 (20).

Modification(s)

It should be noted that the invention is not limited to the above exemplary embodiment but may include any modification and improvement as long as such modification and improvement are compatible with the invention.

For instance, an electron blocking layer may be provided to the emitting layer adjacent to the anode while a hole blocking layer may be provided adjacent to the emitting layer near the cathode. With this arrangement, the electrons and the holes can be trapped in the emitting layer, thereby enhancing probability of exciton generation in the emitting layer.

Moreover, a material having a large triplet energy may be provided adjacent to at least one of a side near the anode and a side near the cathode of the fluorescent-emitting layer. With this arrangement, triplet excitons are trapped within the emitting layer to efficiently cause TTF (Triplet-Triplet Fusion) phenomenon, thereby realizing a high efficiency of the fluorescent-emitting layer.

Further, the materials and treatments for practicing the invention may be altered to other arrangements and treatments as long as such other arrangements and treatments are compatible with the invention.

EXAMPLES

Examples of the invention will be described below. However, the invention is not limited by these Examples.

Used compounds are as follows.

[Formula 7]

HI-1

HT-1
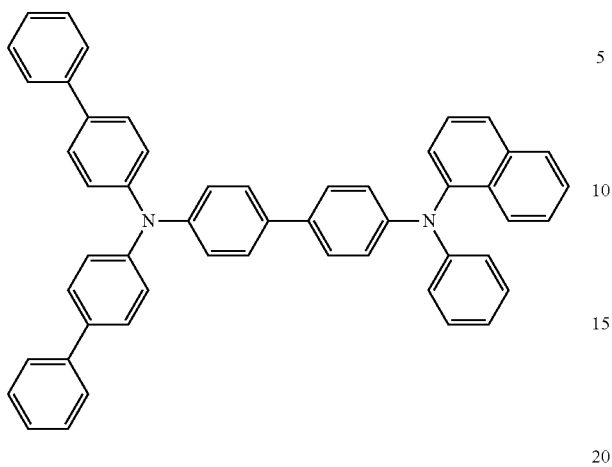
PH-02
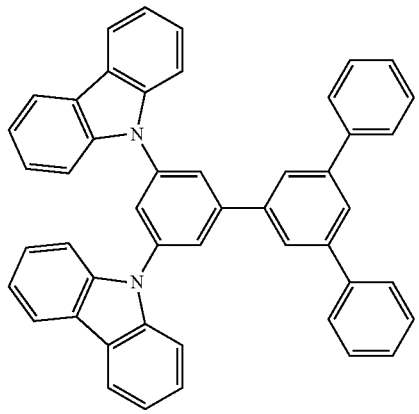
HT-2
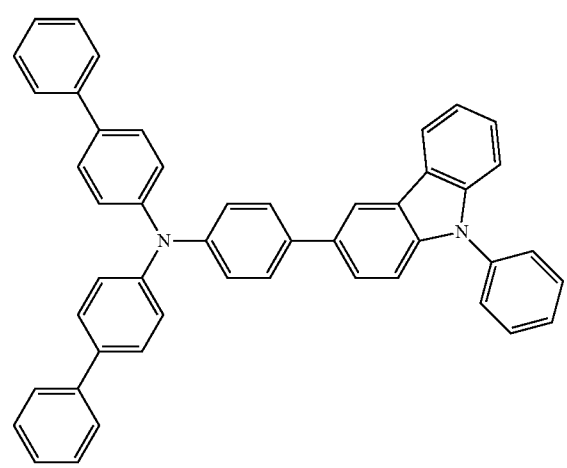
PH-03
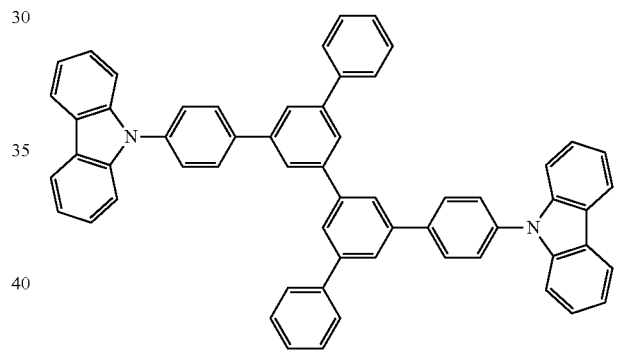
[Formula 8]
PH-01
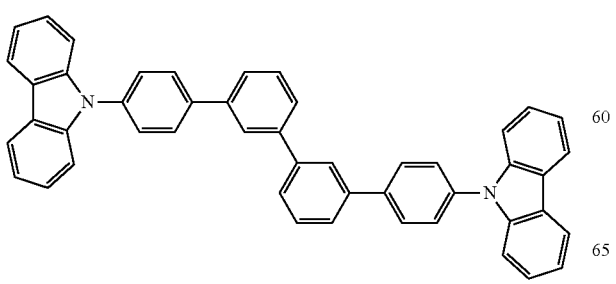
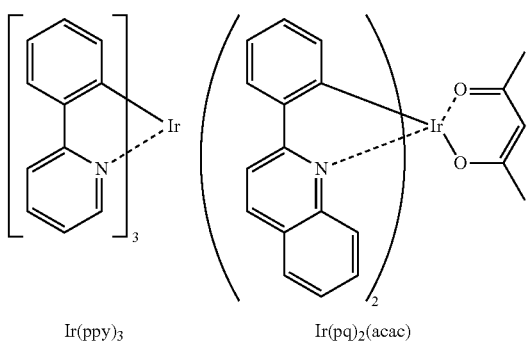
Ir(ppy)₃     Ir(pq)₂(acac)

[Formula 9]
SL-1
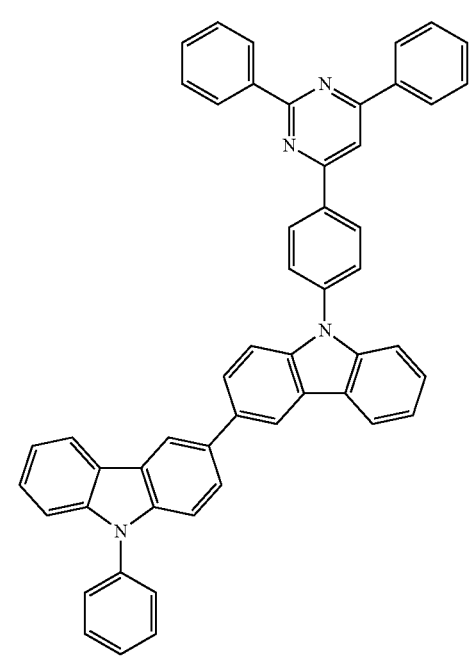
SL-4
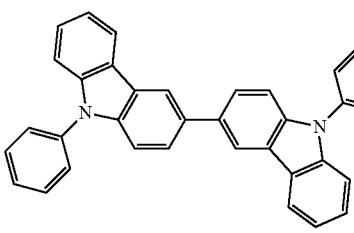
NPD
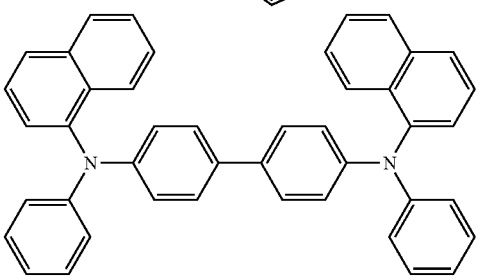
BCP
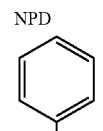
SL-2
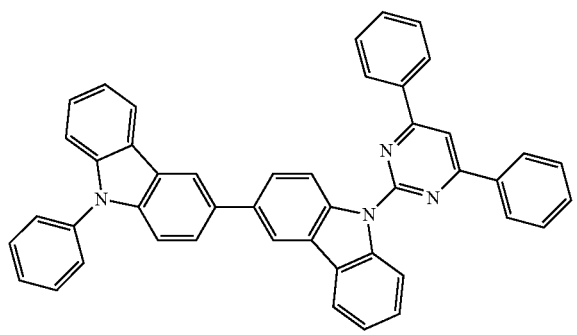
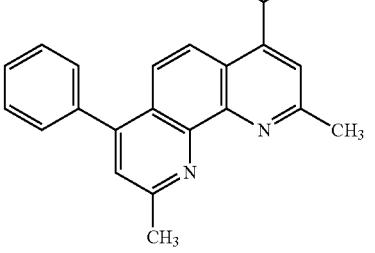
CBP
[Formula 10]
SL-3
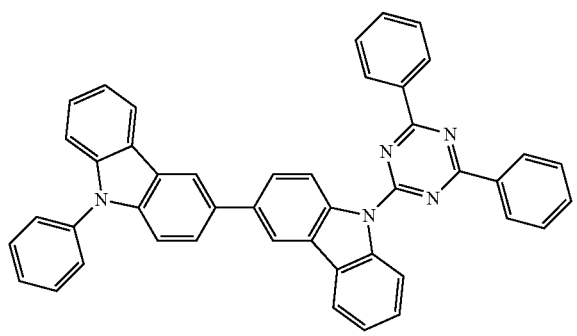
BH-1
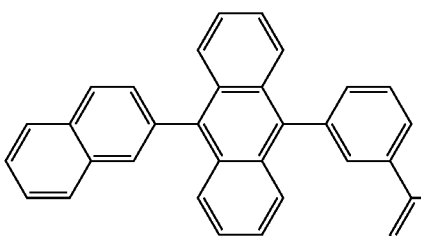

BH-2

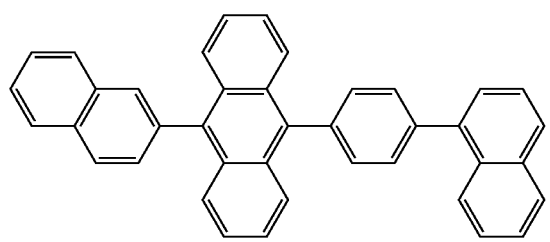

BH-3

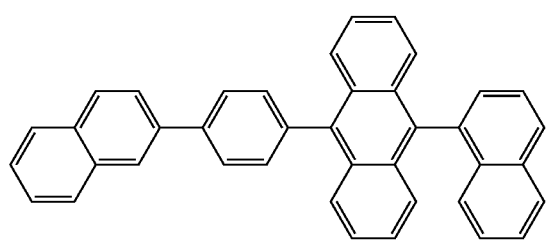

BD-1

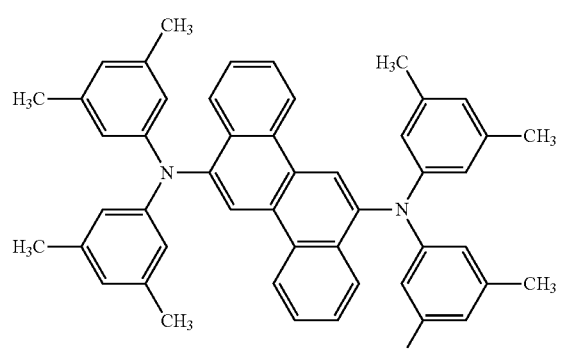

BD-2

[Formula 11]

EEL-1

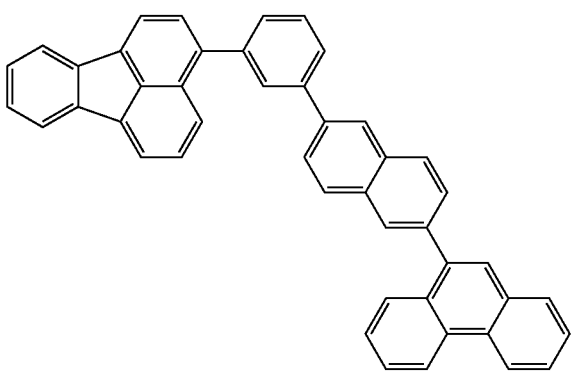

EEL-2

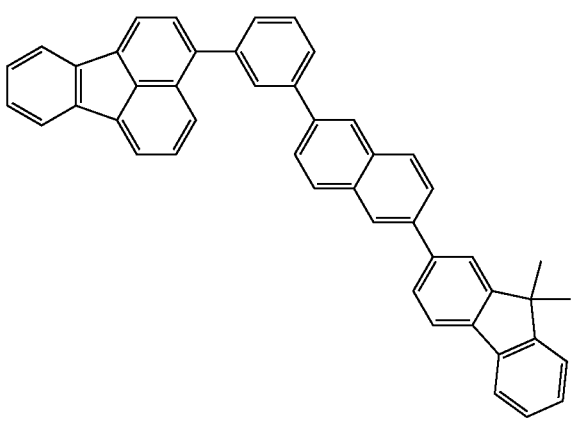

ET-1

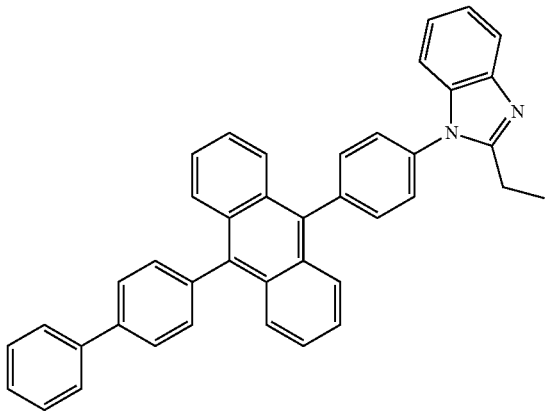

Synthesis of Compound(s)

Synthesis Example 1

Synthesis of Compound SL-1

Synthesis of Intermediate Body 1-1

4-bromobenzaldehyde (25 g, 135 mmol) and acetophenone (16.2 g, 135 mmol) were added to ethanole (200 mL). An aqueous solution of 3M sodium hydrate (60 mL) was further added thereto and stirred at room temperature for seven hours. A precipitated solid was separated by filtration.

Then, the obtained solid was washed with methanol. A white solid intermediate body 1-1 (28.3 g, a yield rate 73%) was obtained.

Synthesis of Intermediate Body 1-2

The intermediate body 1-1 (20 g, 69.7 mmol) and benzamidine hydrochloride (10.8 g, 69.7 mmol) were added to ethanol (300 mL). Sodium hydroxide (5.6 g, 140 mmol) was further added thereto and heated to reflux for eight hours. A precipitated solid was separated by filtration. Then, the obtained solid was washed with hexane. A white solid intermediate body 1-2 (10.3 g, a yield rate 38%) was obtained.

Synthesis of Intermediate Body 1-3

Carbazole (15 g, 89.7 mmol) was added to ethanol (70 mL). Sulfuric acid (6 mL), water (3 mL), $HIO_4 \cdot 2H_2O$ (8.2 g, 35.9 mmol) and $I_2$ (9.1 g, 35.9 mmol) were added thereto and stirred at room temperature for four hours. Water was added to the reaction solution and a precipitated solid was separated by filtration. Then, the obtained solid was washed with methanol. By dissolving the obtained solid in heated toluene for recrystallization, an intermediate body 1-3 (5.1 g, a yield rate 19%) was obtained.

Synthesis of Intermediate Body 1-4

Under an argon gas atmosphere, N-phenylcarbazolyl-3-boronic acid (2.0 g, 7.0 mmol), the intermediate body 1-3 (2.05 g, 7.0 mmol), $Pd(PPh_3)_4$ (0.15 g, 0.14 mmol), toluene (20 mL) and an aqueous solution of 2M sodium carbonate (10.5 mL) were added together, and stirred at 80 degrees C. for seven hours. Water was added to the reaction solution to precipitate solid. Then, the obtained solid was washed with methanol. By washing the obtained solid by heated toluene, an intermediate body 1-4 (2.43 g, a yield rate 84%) was obtained.

Synthesis of Compound SL-1

Under an argon gas atmosphere, to a three-necked flask, the intermediate body 1-2 (2.28 g, 5.88 mmol), the intermediate body 1-4 (2.4 g, 5.88 mmol), CuI (0.56 g, 2.9 mmol), tripotassium phosphate (2.5 g, 11.8 mmol), anhydrous dioxane (30 mL) and cyclohexane diamine (0.33 g, 2.9 mmol) were added together in sequential order, and stirred at 100 degrees C. for eight hours.

Water was added to the reaction solution to precipitate solid. Then, the obtained solid was washed with hexane, followed by methanol. The obtained solid was refined by silica-gel column chromatography, so that a compound SL-1 of a light-yellow solid (2.7 g, a yield rate 64%) was obtained.

As a result of FD-MS (Field Desorption Mass Spectrometry: hereinafter abbreviated to FD-MS) analysis, m/e was equal to 714 while a calculated molecular weight was 714.

A synthesis scheme of the compound SL-1 is shown below.

[Formula 12]

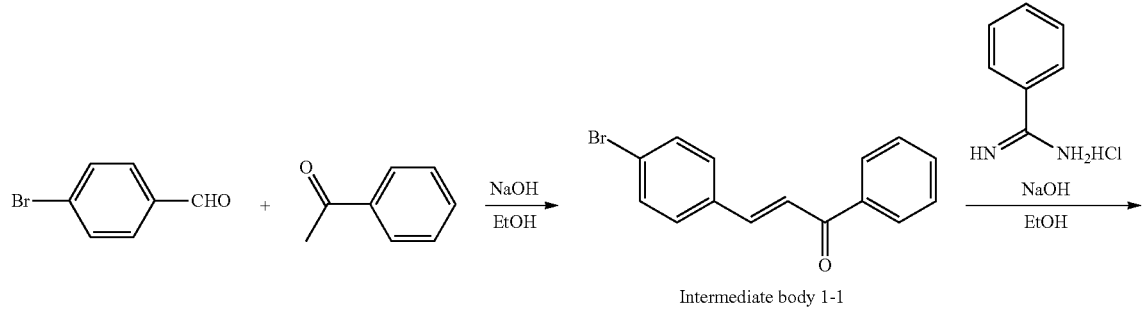

Intermediate body 1-1

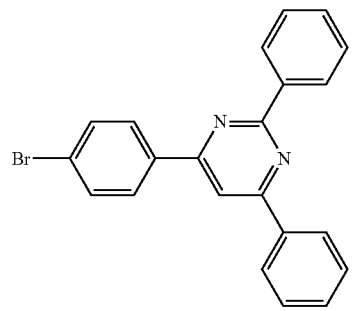

Intermediate body 1-2

-continued
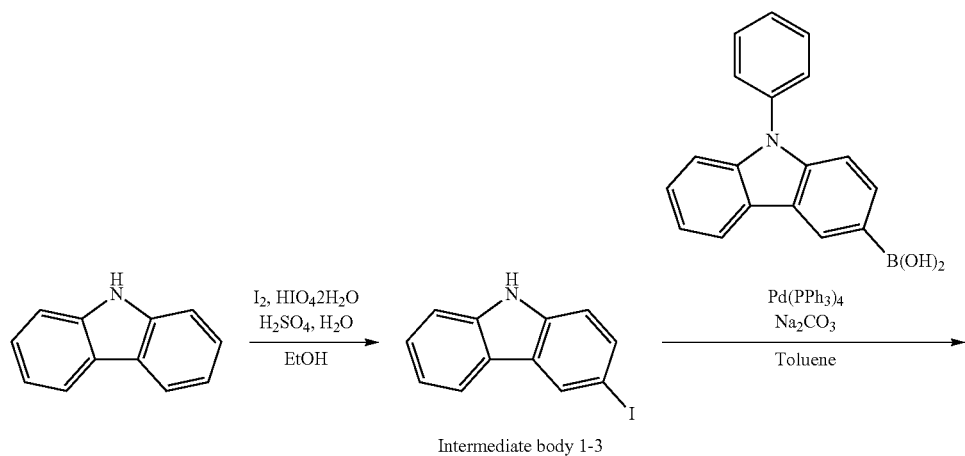
Intermediate body 1-3
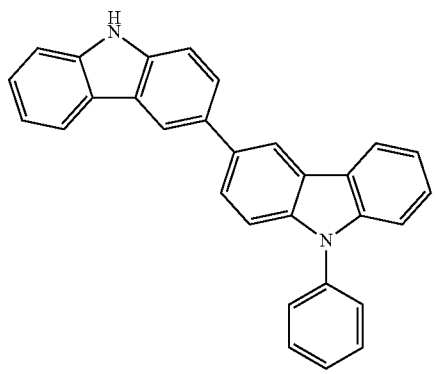
Intermediate body 1-4
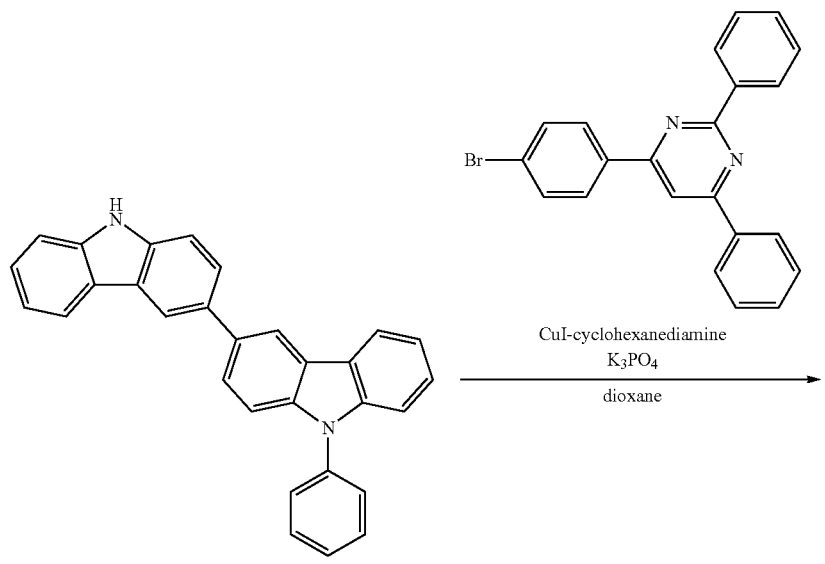
Intermediate body 1-4

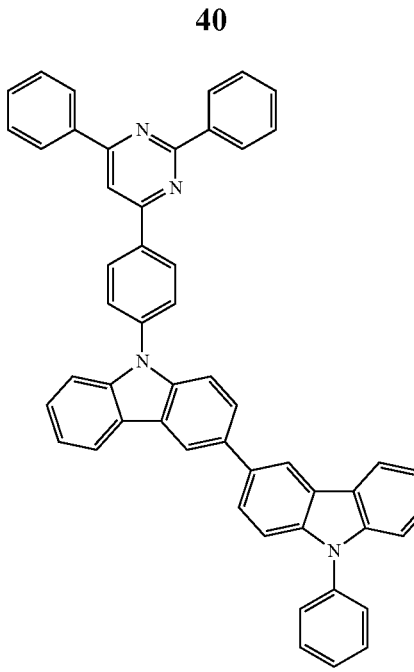

SL-1

Synthesis Example 2

Synthesis of Compound SL-2

An intermediate body 2 was synthesized according to a method described in J. Org. Chem. (pp. 7125-7128) in 2001.

Next, under an argon gas atmosphere, the intermediate body 2 (1.04 g, 3.9 mmol), the intermediate body 1-4 (1.6 g, 3.9 mmol), tris(dibenzylideneacetone)dipalladium (0.071 g, 0.078 mmol), tri-t-butylphosphonium tetrafluoroborate (0.091 g, 0.31 mmol), sodium t-butoxide (0.53 g, 5.5 mmol), and anhydrous toluene (20 mL) were sequentially mixed, and heated to reflux for eight hours.

After the reaction solution was cooled down to the room temperature, an organic layer was removed and an organic solvent was distilled away under reduced pressure. The obtained residue was refined by silica-gel column chromatography, so that a compound SL-2 (1.7 g, a yield rate of 68%) was obtained.

FD-MS analysis consequently showed that m/e was equal to 638 while a calculated molecular weight was 638.

A synthesis scheme of the compound SL-2 is shown below.

[Formula 13]

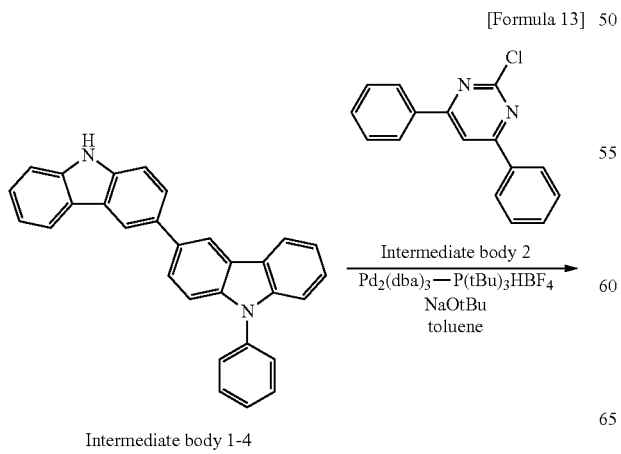

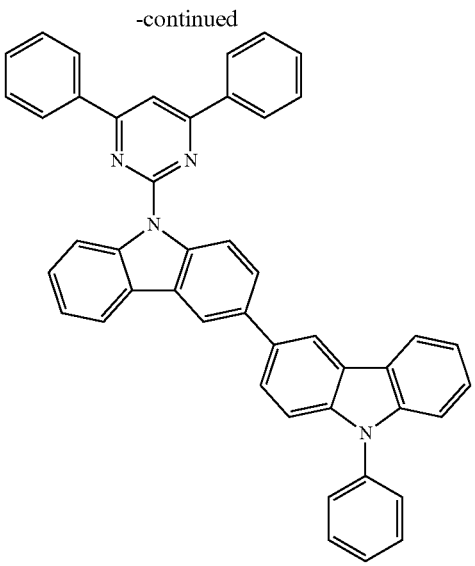

SL-2

Synthesis Example 3

Synthesis of Compound SL-3

An intermediate body 3 was synthesized according to a method described in International Publication No. 2008/056746 (WO2008/056746 A1).

Under an argon gas atmosphere, the intermediate body 3 (1.0 g, 3.9 mmol), the intermediate body 1-4 (1.6 g, 3.9 mmol), tris(dibenzylideneacetone)dipalladium (0.071 g, 0.078 mmol), tri-t-butylphosphonium tetrafluoroborate (0.091 g, 0.31 mmol), sodium t-butoxide (0.53 g, 5.5 mmol), and anhydrous toluene (20 mL) were sequentially mixed, and heated to reflux for eight hours.

After the reaction solution was cooled down to the room temperature, an organic layer was removed and an organic solvent was distilled away under reduced pressure. The obtained residue was refined by silica-gel column chromatography, so that a compound SL-3 (1.8 g, a yield rate of 74%) was obtained.

FD-MS analysis consequently showed that m/e was equal to 639 while a calculated molecular weight was 639.

A synthesis scheme of the compound SL-3 is shown below.

[Formula 14]

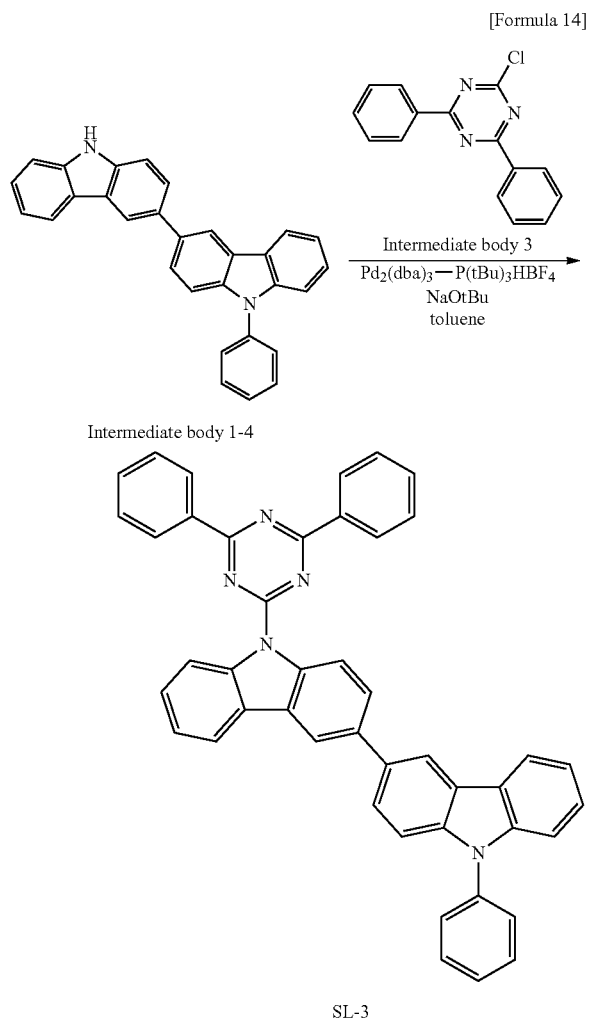

Synthesis Example 4

Synthesis of Compound SL-4

Under a nitrogen atmosphere, the intermediate body 3 (8.0 g, 29.9 mmol), p-chlorophenylboronic acid (5.1 g, 32.9 mmol), tetrakis(triphenylphosphine)palladium (0.63 g, 0.6 mmol), toluene (60 mL) and an aqueous solution of 2M sodium carbonate (30 mL) were added together in sequential order, and heated to reflux for eight hours.

After the reaction solution was cooled down to the room temperature, an organic layer was removed and an organic solvent was distilled away under reduced pressure. The obtained residue was refined by silica-gel column chromatography, so that an intermediate body 4 (7.0 g, a yield rate of 68%) was obtained.

Under an argon gas atmosphere, the intermediate body 4 (6.5 g, 18.9 mmol), the intermediate body 1-4 (7.7 g, 18.9 mmol), palladium acetate (0.085 g, 0.38 mmol), sodium t-butoxide (2.72 g, 28.4 mmol), anhydrous toluene (60 mL), and tri-t-butyl phosphine (0.077 g, 0.38 mmol) were sequentially mixed, and stirred at 90 degrees C. for eight hours.

After the reaction solution was cooled down to the room temperature, an organic layer was removed and an organic solvent was distilled away under reduced pressure. The obtained residue was refined by silica-gel column chromatography, so that a compound SL-4 (7.8 g, a yield rate of 58%) was obtained.

As a result of FD-MS analysis, m/e was equal to 715 while a calculated molecular weight was 715.

A synthesis scheme of the compound SL-4 is shown below.

[Formula 15]

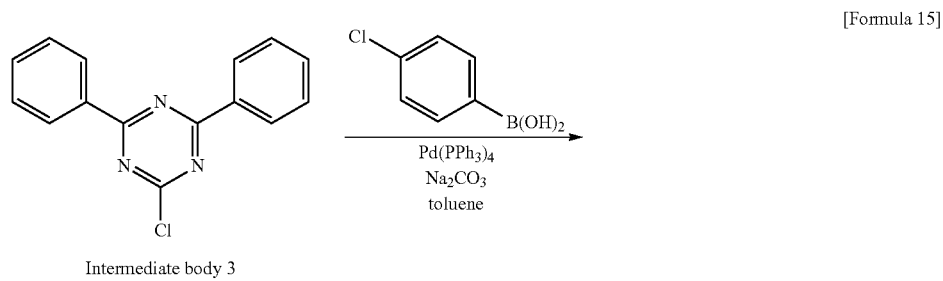

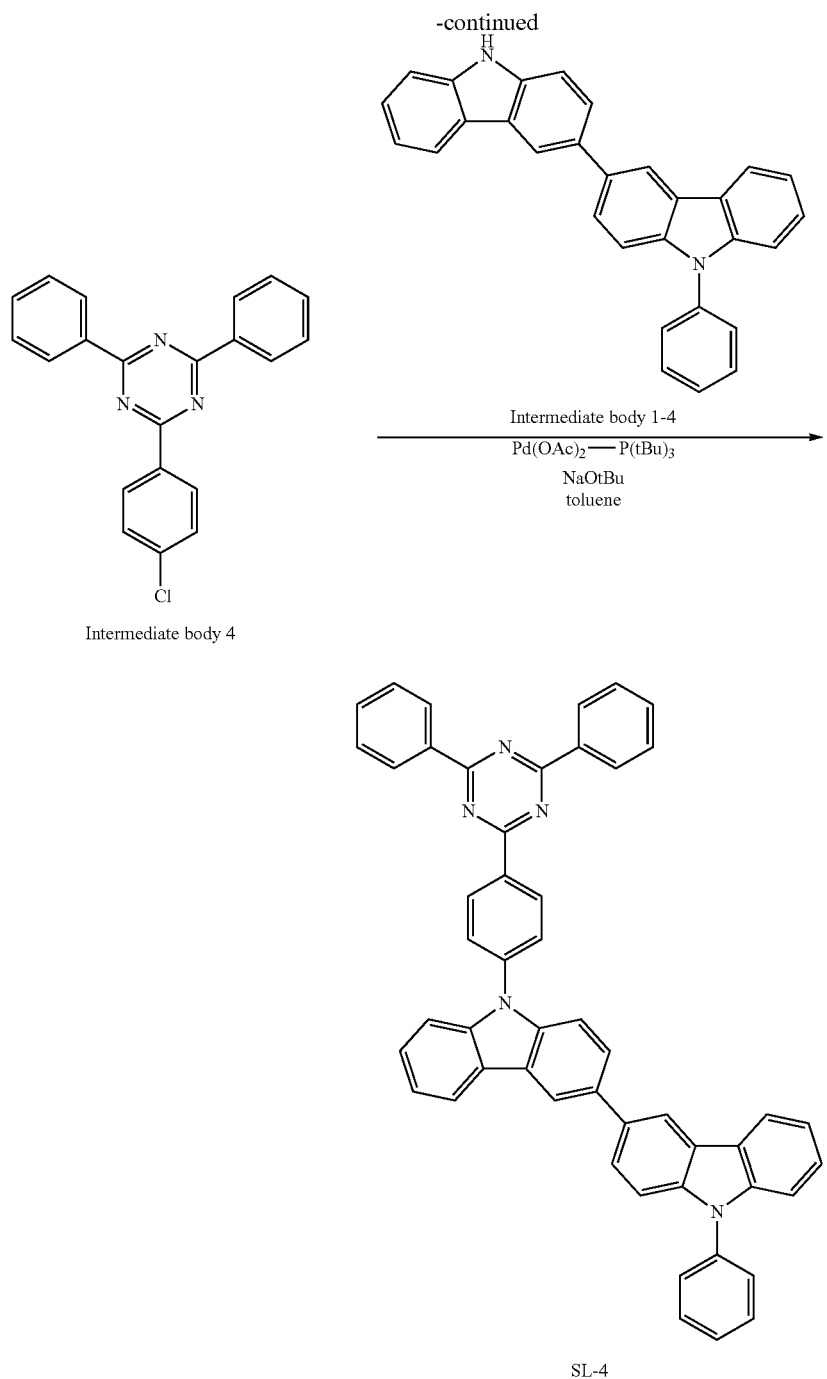

SL-4

Evaluation of Compounds
(1) Singlet Energy EgS
Singlet Energy EgS was obtained according to the following method.
The target compound to be measured was evaporated on a quartz substrate to prepare a sample. An absorption spectrum of the sample was measured at a normal temperature (300K). The absorption spectrum was expressed in coordinates of which ordinate axis indicated absorbance and of which abscissa axis indicated the wavelength. A tangent was drawn to the rise of the absorption spectrum on the long-wavelength side, and a wavelength value λedge (nm) at an intersection of the tangent and the abscissa axis was obtained. The wavelength value was converted to an energy value by the following conversion equation. The energy value was defined as EgS.

The conversion equation:

$$EgS\,(\mathrm{eV}) = 1239.85/\lambda\mathrm{edge}$$

For the measurement of the absorption spectrum, a spectrophotometer (U3310 manufactured by Hitachi, Ltd.) was used.

The measurement results of EgS of the compounds are shown in Table 1.

(2) Energy Gap $Eg_{77K}$ and Triplet Energy EgT $Eg_{77K}$ and EgT were obtained by the following method.

Each of the compounds was measured by a known method of measuring phosphorescence (e.g. a method described in "Hikarikagaku no Sekai (The World of Photochemistry)" (edited by The Chemical Society of Japan, 1993, on and near page 50). Specifically, each compound was dissolved in a solvent (EPA (diethylether: isopentane:ethanol=5:5:5 (volume ratio), a spectral grade solvent) to provide a sample for phosphorescence measurement (Sample 10 μmol/liter). The sample for phosphorescence measurement was put into a quartz cell, cooled to 77K and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λedge (nm) at an intersection of the tangent and the abscissa axis was obtained. The wavelength value was converted to an energy value by the following conversion equation. The energy value was defined as $Eg_{77K}$ or $EgT_D$.

The conversion equation:

$$Eg_{77K}(eV)=1239.85/\lambda edge : EgT(eV)=1239.85/\lambda edge$$

For phosphorescence measurement, a spectrophotofluorometer body F-4500 and optional accessories for low temperature measurement (which were manufactured by Hitachi High-Technologies Corporation) were used. The measurement instrument is not limited to this arrangement. A combination of a cooling unit, a low temperature container, an excitation light source and a light-receiving unit may be used for measurement.

The measurement results of $Eg_{77K}$ or EgT of the compounds are shown in Table 1.

In addition to the above, the measurement results of $EgT_D$ of Ir(ppy)$_3$ and Ir(Ph-ppy)$_2$ (phosphorescent dopant materials) is as follows.

Ir(ppy)$_3$: 2.62[eV]

Ir(pq)$_2$(acac): 2.21 [eV]

(3) ΔST

ΔST was obtained as a difference between EgS and $Eg_{77K}$ measured in the above (1) and (2) (see the above formula (1)). The results of the evaluation are shown in Table 1.

(4) Measurement of Δn

Δn was calculated based on the refractive index of each compound measured by the spectroscopic ellipsometry method. The spectroscopic ellipsometry method is a measurement method of an optical constant (i.e., a refractive index n and an extinction coefficient k) and a thickness of a thin film.

Figure 7A:
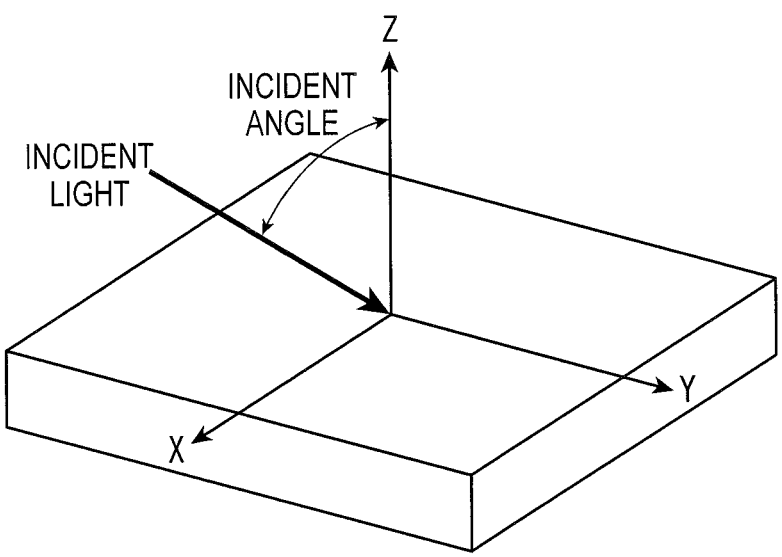
FIG. 7A shows an example of spectroscopic ellipsometry measurement.
Figure 7B:
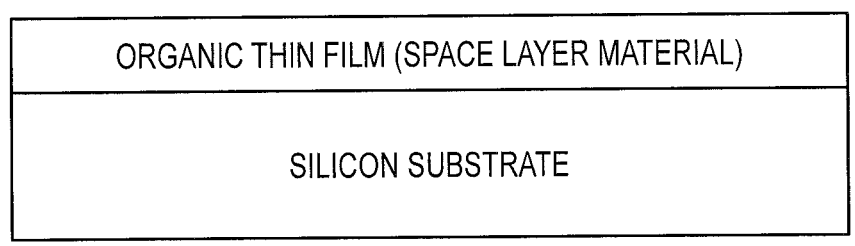
FIG. 7B shows a cross section of an organic thin film on a silicon substrate, in which the organic thin film is to be measured in the spectroscopic ellipsometry measurement of FIG. 7A.

In the invention, a variable incident angle high-speed spectroscopic ellipsometer (manufactured by J. A. Woollam Co., Inc.: M-2000U) was used. FIG. 7A shows an example of spectroscopic ellipsometry measurement. FIG. 7A shows an incident angle of an incident light from a light source. FIG. 7B shows a cross section of an organic thin film (a measurement target) on a silicon substrate.

Each compound was evaporated on the silicon substrate (Si (100)) to form a 100-nm organic thin film The organic thin film on the silicon substrate was irradiated with light at every five degrees in a range of 45 degrees to 80 degrees of the incident angle of the incident light from the light source while a wavelength of the light being changed at every 1.6 nm in a range of 245 nm to 1000 nm, thereby measuring ellipsometric parameters ψ and Δ. The obtained parameters were analyzed together using an analysis software WVASE32 (manufactured by J. A. Woollam Co., Inc) to examine optical anisotropy of the film. The anisotropy of the optical constant (i.e., the refractive index n and the extinction coefficient k) of the film reflects the anisotropy of molecular orientation in the film. The measurement method and the analysis methods are described in detail in the above Documents 6 to 8.

Δn was obtained as a difference between the refractive index n in the perpendicular direction z relative to the silicon substrate and the refractive index n in the parallel direction x relative to the silicon substrate (see the above numerical formula (2)). The perpendicular direction z and the parallel direction x relative to the silicon substrate are shown in FIG. 7A.

The measurement results of Δn at a wavelength of 700 nm of the compounds are shown in Table 1.

(5) Measurement of Half Bandwidth

A half bandwidth of photoluminescence spectrum was obtained as follows.

Each compound was dissolved in a solvent (dichloromethane) to prepare a sample for fluorescence measurement (Sample 10 μmol/liter). The sample for fluorescence measurement was put into a quartz cell and irradiated with excitation light at a normal temperature (300K), so that fluorescence intensity was measured while changing a wavelength. The photoluminescence spectrum was expressed in coordinates of which ordinate axis indicated fluorescence intensity and of which abscissa axis indicated the wavelength. For fluorescence measurement, a spectrophotofluorometer F-4500 (manufactured by Hitachi High-Technologies Corporation) was used.

The half bandwidth (unit: nm) was measured based on the photoluminescence spectrum.

The measurement results of the half bandwidth of the compounds are shown in Table 1.

TABLE 1

| material | Eg(S) [eV] | $Eg_{77K}$ or EgT [eV] | Δ ST | Δ n | half bandwidth [nm] |
|---|---|---|---|---|---|
| SL-01 | 2.90 | 2.80 | 0.14 | 0.20 | 93 |
| SL-02 | 3.34 | 2.91 | 0.43 | 0.16 | 92 |
| SL-03 | 3.18 | 2.84 | 0.34 | 0.16 | 94 |
| SL-04 | 2.84 | 2.77 | 0.07 | 0.20 | 87 |
| NPD | 3.09 | 2.46 | 0.63 | 0.04 | 79 |
| BCP | 3.41 | 2.68 | 0.73 | unmeasurable | 52 |
| BCP:NPD (90%:10%) | — | — | — | 0.02 | — |
| BCP:NPD (85%:15%) | — | — | — | 0.01 | — |
| BCP:NPD (80%:20%) | — | — | — | 0.02 | — |
| PH-01 | 3.54 | 2.84 | 0.70 | — | — |
| PH-02 | 3.57 | 2.89 | 0.68 | — | — |
| PH-03 | 3.53 | 2.84 | 0.69 | — | — |
| CBP | 3.52 | 2.88 | 0.64 | — | — |
| BD-01 | 2.84 | 2.27 | 0.57 | — | — |
| BD-02 | 2.75 | 2.13 | 0.62 | — | — |

Preparation and Evaluation of Organic EL Device

The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum evaporation apparatus. Initially, a compound HI-1 was evaporated on a surface of the glass substrate where the transparent electrode line was provided in a manner to cover the transparent electrode, thereby forming a 10-nm thick film of the compound HI-1. The HI-1 film serves as a hole injecting layer.

After the film formation of the HI-1 film, a compound HT-1 was evaporated on the HI-1 film to form a 30-nm thick HT-1 film. Moreover, a compound HT-2 was evaporated on the HT-1 film to form a 10-nm thick HT-2 film. The HT-1 film and the HT-2 film serve as a hole transporting layer.

Then, a compound PH-01 (a host material), Ir(ppy)$_3$ (a green phosphorescent dopant material) and Ir(pq)$_2$(acac) (a red phosphorescent dopant material) were co-evaporated on the HT-2 film to form a 5-nm thick green•red phosphorescent-emitting layer (the first emitting layer). The concentration of the dopant material was set at 10 mass % of Ir(ppy)$_3$ and 0.6 mass % of Ir(pq)$_2$(acac).

The compound SL-1 was evaporated on the green•red phosphorescent-emitting layer to form a 4-nm thick space layer.

A compound BH-1 (a host material) and a compound BD-1 (a blue fluorescent dopant material) were co-evaporated on the space layer to form a 20-nm thick blue fluorescent-emitting layer (the second emitting layer). The concentration of the dopant material was set at 10 mass %.

A compound EEL-1 was evaporated on the blue fluorescent-emitting layer to form a 5-nm thick blocking layer.

An electron transporting compound ET-1 was evaporated on the blocking layer to form a 25-nm thick electron transporting layer.

LiF was evaporated on the electron transporting layer to form a 1-nm thick LiF film.

A metal Al was evaporated on the LiF film to form an 80-nm thick metal cathode.

Thus, the organic EL device of Example 1 was prepared.

A device arrangement of the organic EL device in Example 1 is schematically shown as follows:
ITO(130)/HI-1(10)/HT-1(30)/HT-2(10)/PH-01:Ir(ppy)$_3$:Ir(pq)$_2$(acac)(5.10%:0.6%)/SL-1(4)/BH-1:BD-1(20.10%)/EEL-1(5)/ET-1(25)/LiF(1)/Al(80).

Numerals in parentheses represent a film thickness (unit: nm). Numerals represented by percentage in the same parentheses represent a ratio (mass %) of an added component such as the phosphorescent dopant material in the emitting layer. The same applies for the following schematic device arrangements.

Comparatives 1 to 6

Organic EL devices of Comparatives 1 to 6 were prepared in the same manner as that of the Example 1 except that the compounds of the space layer material were changed to the compounds used for the bipolar layer (corresponding to the space layer of the invention) described Patent Literature 1 as shown in Table 2. Regarding the space layer of each of Comparatives 1 and 4 to 6, a mass ratio between BCP and NPD is shown in Table 2.

Table 2 includes a part of the measurement results shown in Table 1 for comparison purpose.

TABLE 2

| | Space Layer | | | | | Device evaluation results | | | | | | |
|---|---|---|---|---|---|---|---|---|---|---|---|---|
| | compound | EgS [eV] | Eg$_{77K}$ [eV] | ΔST [eV] | Δn | half bandwidth [nm] | drive voltage [V] | CIE x | CIE y | luminous efficiency [cd/A] | EQE [%] | color temperature CCT [K] | color rendering index CRI |
| Example 1 | SL-1 | 2.94 | 2.80 | 0.14 | 0.20 | 93 | 3.98 | 0.46 | 0.42 | 39.5 | 17.3 | 2800 | 76 |
| Comparative 1 | BCP:NPD (50%:50%) | — | — | — | 0.02 | — | 3.76 | 0.21 | 0.19 | 8.0 | 5.7 | un-measurable | unmeasurable |
| Comparative 2 | NPD | 3.09 | 2.46 | 0.63 | 0.04 | 79 | 3.96 | 0.16 | 0.15 | 8.2 | 6.5 | un-measurable | unmeasurable |
| Comparative 3 | BCP | 3.41 | 2.68 | 0.73 | un-measurable | 52 | 3.84 | 0.51 | 0.47 | 46.0 | 19.0 | 2500 | 60 |
| Comparative 4 | BCP:NPD (90%:10%) | — | — | — | 0.02 | — | 3.80 | 0.49 | 0.41 | 26.8 | 12.3 | 2300 | 67 |
| Comparative 5 | BCP:NPD (85%:15%) | — | — | — | 0.01 | — | 3.77 | 0.45 | 0.37 | 20.5 | 10.0 | 2600 | 67 |
| Comparative 6 | BCP:NPD (80%:20%) | — | — | — | 0.02 | — | 3.76 | 0.42 | 0.35 | 17.7 | 8.6 | 2900 | 71 |

Evaluation of Organic EL Device

The prepared organic EL devices were evaluated in terms of drive voltage, CIE1931 chromaticity, current efficiency, external quantum efficiency EQE, color temperature CCT and color rendering index CRI. The results of the evaluation are shown in Table 2. Evaluation was conducted as follows.

Drive Voltage

Voltage was applied between ITO (anode) and Al (cathode) such that a current density was 10 mA/cm$^2$, where the voltage (unit: V) was measured.

Current Efficiency

Voltage was applied on each of the organic EL devices such that a current density was 10 mA/cm$^2$, where spectral-radiance spectrum was measured by a spectroradiometer CS1000A (manufactured by Konica Minolta Holdings, Inc.) to calculate a current efficiency (unit: cd/A).

CIE1931 Chromaticity

Voltage was applied on each of the organic EL devices such that the current density was 10 mA/cm$^2$, where CIE1931 chromaticity coordinates (x, y) were measured using the above spectroradiometer.

External Quantum Efficiency

Voltage was applied on each of the organic EL devices such that a current value was 10 mA/cm$^2$, where spectral-radiance spectrum was measured by the above spectroradiometer. An external quantum efficiency EQE (unit: %) was calculated from the obtained spectral-radiance spectrum. The spectral-radiance spectra are shown in Table 8.

Color Temperature

Voltage was applied on each of the organic EL devices such that a current density was 10 mA/cm$^2$, where spectral-radiance spectrum was measured by the above spectroradiometer and a color temperature was calculated according to "Methods for determining color temperature or correlated color temperature" described in JIS (Japanese Industrial Standards) Z8725.

Color Rendering Index

A color rendering index indicates how accurately a color of an object lighted by a light source can be appreciated by humans. Blackbody radiation of the object at the same color temperature is defined as 100 of the color rendering index. Voltage was applied on each of the organic EL devices such that a current density was 10 mA/cm$^2$, where spectral-radiance spectrum was measured by the above spectroradiometer and an average color-rendering evaluation Ra was calculated according to "Methods for evaluating color rendering property of light source" described in JIS Z8726. It can be said that the color rendering property is more excellent as the value is closer to 100 of the reference.

As shown in Table 2, the organic EL device of Example 1 was excellent in the luminous efficiency (current efficiency and external quantum efficiency) and the color rendering property.

The organic EL devices of Comparatives 1 and 2 mostly emitted blue light and exhibited a low external quantum efficiency as shown by spectral radiance spectra in FIG. 8, so that a color rendering index was not measured. In other words, it is speculated that electrons did not reach the phosphorescent-emitting layer since the space layer contained hole-transporting NPD.

The organic EL device of Comparative 3 did not emit blue light but red light and green light as shown by spectral radiance spectrum in FIG. 8. In other words, although a high external quantum efficiency was shown due to emission of the phosphorescent-emitting layer, the blue fluorescent-emitting layer did not emit to lower a color rendering index. In further other words, it is speculated that holes did not reach the fluorescent-emitting layer since the space layer contained electron-transporting BCP.

In the organic EL devices of Comparatives 4 to 6, the arrangement of the space layer was adjusted such that the organic EL devices had the same chromaticity by well-balanced transportation of electrons and holes, for comparison with the organic EL device of Example 1 in terms of the current efficiency and the external quantum efficiency. Specifically, a ratio of blue, red and green lights was adjusted by altering a mixture ratio of BCP:NPD.

In the spectral radiance spectrum of the organic EL device of Comparative 4 in which the space layer was provided at BCP:NPD=90%:10% (mass ratio), a spectrum profile was the same (i.e., the same chromaticity) as that of spectral radiance spectrum of the organic EL device of Example 1 shown in FIG. 8, but a luminous intensity was weaker than that of Example 1. This is relevant to the luminous efficiency and the external quantum efficiency of the organic EL device of Comparative 4 lower than those of the organic EL device of Example 1 as shown in Table 2.

Moreover, even by altering the mixture ratio of BCP:NPD in Comparatives 5 to 6, the obtained luminous efficiency and external quantum efficiency did not reach those of Example 1.

Possible reasons are as follows. In the organic EL devices of Comparatives 4 to 6, as indicated by reduction of drive voltage, transportation of electrons and holes are well balanced due to a co-evaporation layer of the electron-transporting BCP and the hole-transporting NPD. However, it is speculated that a small value of $Eg_{77K}$ of BCP and NPD causes diffusion of triplet excitons to lower the luminous efficiency and the external quantum efficiency.

On the other hand, it is realized that the organic EL device of Example 1 exhibits a high color rendering index and well-balanced emission of blue, green and red lights. Moreover, the organic EL device of Example 1 is provided as a white-emitting device having a high efficiency while keeping the drive voltage at 4 V or less. It can be said that the organic EL device of Example 1 provides advantages obtained by using a compound having a small $\Delta ST$ as the space layer material.

Thus, the organic EL device of Example 1 using the specific compound in the invention as the space layer material was recognized as having excellent luminous efficiency and color rendering property in good balance.

Examples 2 to 4

Organic EL devices of Examples 2 to 4 were prepared in the same manner as in the Example 1 except that the compounds shown in Table 3 were used as the space layer and the fluorescent-emitting layer. The prepared organic EL devices were evaluated in the same manner as in Example 1. The results are shown in Table 3.

A device arrangement of the organic EL devices in Examples 2 to 4 is schematically shown as follows:
ITO(130)/HI-1(10)/HT-1(30)/HT-2(10)/PH-01:Ir(ppy)$_3$:Ir(pq)$_2$(acac)(5.10%:0.6%)/SL-X(4)/BH-X:BD-X(20:10%)/EEL-1(5)/ET-1(25)/LiF(1)/Al(80).

Compounds SL-X, BH-X and BD-X were replaced depending on Examples as shown in Table 3.

TABLE 3

| | Space layer | | | | fluorescent-emitting layer | device evaluation results | | | | | | |
|---|---|---|---|---|---|---|---|---|---|---|---|---|
| | compound (SL-X) | EgS [eV] | Eg$_{77K}$ [eV] | $\Delta ST$ [eV] | $\Delta n$ | half band-width [nm] | (second emitting layer) compound (BH-X:BD-X) | drive voltage [V] | CIE x | CIE y | luminous efficiency [cd/A] | EQE [%] | color temperature CCT [K] | color rendering index CRI |
| Example 2 | SL-1 | 2.94 | 2.80 | 0.14 | 0.20 | 93 | BH-1:BD-2 | 3.85 | 0.50 | 0.44 | 44.1 | 19.3 | 2400 | 69 |
| Example 3 | SL-2 | 3.34 | 2.91 | 0.43 | 0.16 | 92 | BH-1:BD-1 | 3.89 | 0.47 | 0.42 | 35.9 | 15.9 | 2600 | 74 |
| Example 4 | SL-2 | 3.34 | 2.91 | 0.43 | 0.16 | 92 | BH-1:BD-2 | 3.81 | 0.49 | 0.43 | 39.8 | 17.3 | 2500 | 71 |

As shown in Table 3, the organic EL devices of Examples 2 to 4 were also recognized as having excellent luminous efficiency and color rendering property in good balance.

Examples 5 to 7

A device arrangement of the organic EL devices in Examples 5 to 7 is shown as follows:
ITO(130)/HI-1(10)/HT-1(30)/HT-2 Ir(pq)$_2$(acac)(10, 5%)/ PH-01 IR(ppy)$_3$(3, 10%)/SL-X(3)BH-1:BD-1(20, 10%)/ EEL-2(5)/ET-1(25)/LiF(1)/Al(80).

A compound SL-X was replaced depending on Examples as shown in Table 4.

Examples 8 to 10

A device arrangement of the organic EL devices in Examples 8 to 10 is shown as follows:
ITO(130)/HI-1(10)/HT-1 (30)/HT-2 (10)/PGH:Ir(ppy)$_3$:Ir (pq)$_2$(acac)(5, 10%:0.6%)/SL-1(4)/BH-1:BD-1(20, 10%)/ EEL-1(5)/ET-1(25)/LiF(1)/Al(80).

A compound PGH was replaced depending on Examples as shown in Table 5.

Thus, the organic EL devices of Examples 8 to 10 were prepared in the same manner as that of Example 1 except that the phosphorescent host material of the phosphorescent-emitting layer was replaced.

The prepared organic EL devices were evaluated in the same manner as in Example 1. The results are shown in Table 5.

TABLE 5

| | space layer | | | | | phosphorescent-emitting layer (first emitting layer) compound (PGH) | device evaluation results | | | | | |
|---|---|---|---|---|---|---|---|---|---|---|---|---|
| | compound (SL-X) | EgS [eV] | Eg$_{77K}$ [eV] | Δ ST [eV] | Δ n | half band-width [nm] | drive voltage [V] | CIE x | CIE y | luminous efficiency [cd/A] | EQE [%] | color temperature CCT [K] | color rendering index CRI |
| Example 8 | SL-1 | 2.94 | 2.80 | 0.14 | 0.20 | 93 | PH-02 | 3.87 | 0.51 | 0.44 | 39.8 | 17.5 | 2300 | 68 |
| Example 9 | SL-1 | 2.94 | 2.80 | 0.14 | 0.20 | 93 | PH-03 | 3.86 | 0.47 | 0.43 | 38.7 | 16.8 | 2700 | 74 |
| Example 10 | SL-1 | 2.94 | 2.80 | 0.14 | 0.20 | 93 | CBP | 3.84 | 0.47 | 0.43 | 39.6 | 17.3 | 2600 | 75 |

Thus, the organic EL devices of Examples 5 to 7 were prepared in the same manner as in the organic EL device of Example 2 except that no HT-2 film was formed, the phosphorescent-emitting layer was replaced by the first emitting layer and the third emitting layer laminated to each other, the compound of the space layer was replaced, a thickness of the space layer was changed, and the compound of the blocking layer was replaced. Compounds of the space layer, host materials of the fluorescent-emitting layer and the dopant materials are shown in Table 4. In the first emitting layer, the host material was PH-01 and the phosphorescent dopant material was Ir(ppy)$_3$. In the third emitting layer, the host material was HT-2 and the phosphorescent dopant material was Ir(pq)$_2$ (acac).

The prepared organic EL devices were evaluated in the same manner as in Example 1. The results are shown in Table 4.

As shown in Table 5, the organic EL devices of Examples 8 to 10 were also recognized as having excellent luminous efficiency and color rendering property in good balance.

Example 11

An arrangement of an organic EL device in Example 11 is shown as follows: ITO(130)/HI-1(10)/HT-1(70)/HT-2(10)/ PH-01:Ir(ppy)$_3$:Ir(pq)$_2$(acac)(5, 10%:0.4%)/SL-1 (5)/BH-1: BD-1 (20, 10%)/EEL-2(5)/ET-1(25)/LiF(1)/Al(80).

The organic EL device in Example 11 was prepared in the same manner as that of Example 1 except that a thickness of each of the HT-1 film and the space layer was changed, a mass ratio of Ir(ppy)$_3$ (green phosphorescent dopant material) and Ir(pq)$_2$(acac) (red phosphorescent dopant material) in the first emitting layer was changed and the compound of the blocking layer was replaced.

TABLE 4

| | space layer | | | | | fluorescent-emitting layer | device evaluation results | | | | | |
|---|---|---|---|---|---|---|---|---|---|---|---|---|
| | compound (SL-X) | EgS [eV] | Eg$_{77K}$ [eV] | Δ ST [eV] | Δ n | half band-width [nm] | (second emitting layer) compound (BH-X:BD-X) | drive voltage [V] | CIE x | CIE y | luminous efficiency [cd/A] | EQE [%] | color temperature CCT [K] | color rendering index CRI |
| Example 5 | SL-2 | 3.34 | 2.91 | 0.43 | 0.16 | 92 | BH-1:BD-1 | 3.80 | 0.48 | 0.41 | 36.2 | 17.2 | 2500 | 78 |
| Example 6 | SL-3 | 3.18 | 2.84 | 0.34 | 0.16 | 94 | BH-1:BD-1 | 3.84 | 0.51 | 0.44 | 43.0 | 19.8 | 2300 | 74 |
| Example 7 | SL-4 | 2.84 | 2.77 | 0.21 | 0.20 | 87 | BH-1:BD-1 | 3.78 | 0.52 | 0.44 | 41.9 | 19.6 | 2200 | 73 |

As shown in Table 4, the organic EL devices of Examples 5 to 7 were also recognized as having excellent luminous efficiency and color rendering property in good balance.

The prepared organic EL devices were evaluated in the same manner as in Example 1. The results are shown in Table 6.

TABLE 6

| | space layer | | | | | device evaluation results | | | | | | |
|---|---|---|---|---|---|---|---|---|---|---|---|---|
| | | | | | | | | | | | color temperature CCT [K] | color rendering index CRI |
| | compound (SL-X) | EgS [eV] | Eg$_{77K}$ [eV] | Δ ST [eV] | Δ n | half bandwidth [nm] | drive voltage [V] | CIE x | CIE y | luminous efficiency [cd/A] | EQE [%] | | |
| Example 11 | SL-1 | 2.94 | 2.80 | 0.14 | 0.20 | 93 | 4.24 | 0.39 | 0.36 | 30.8 | 15.1 | 3700 | 82 |

As shown in Table 6, the organic EL device of Example 11 was also recognized as having excellent luminous efficiency and color rendering property in good balance. Particularly, the color rendering index of the organic EL device of Example 11 was the most excellent in those of Examples and Comparatives.

Examples 12 to 14

In addition to the above compounds, the following compounds were used in Examples 12 to 14.

[Formula 16]

PH-04

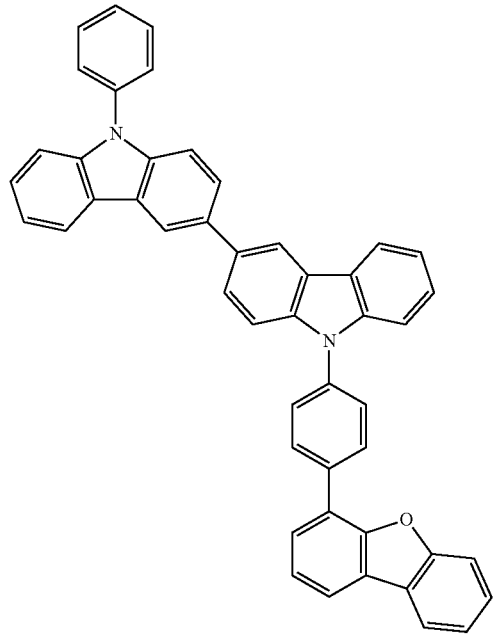

PBD-1

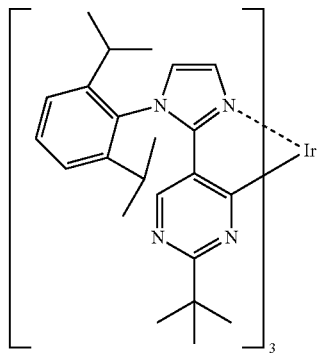

ET-02

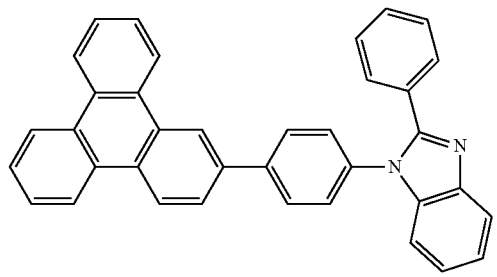

An organic EL device of Example 12 was prepared as follows.

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum evaporation apparatus. Initially, the compound HI-1 was evaporated on a surface of the glass substrate where the transparent electrode line was provided in a manner to cover the transparent electrode, thereby forming a 5-nm thick film of the compound HI-1. The HI-1 film serves as a hole injecting layer.

After the film formation of the HI-1 film, a compound HT-2 was evaporated on the HI-1 film to form a 30-nm thick HT-2 film. The HT-2 film serves as a hole transporting layer.

Then, a compound PH-01 (a host material), Ir(ppy)$_3$ (a green phosphorescent dopant material) and Ir(pq)$_2$(acac) (a red phosphorescent dopant material) were co-evaporated on the HT-2 film to form a 5-nm thick green•red phosphorescent-emitting layer (the first emitting layer). A concentration of the dopant material was set at 10 mass % of Ir(ppy)$_3$ and 0.6 mass % of Ir(pq)$_2$(acac).

The compound SL-1 was evaporated on the green•red phosphorescent-emitting layer to form a 5-nm thick space layer.

PBH-1

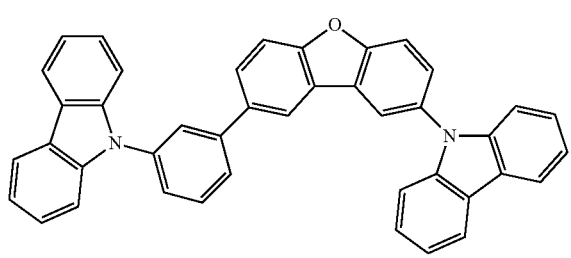

A compound PBH-1 (host material) and a compound PBD-1 (blue phosphorescent dopant material) were co-evaporated on the space layer to form a 30-nm thick blue phosphorescent-emitting layer (the second emitting layer). The concentration of the dopant material was set at 20 mass %.

The compound PBH-1 was evaporated on the blue phosphorescent-emitting layer to form a 5-nm thick blocking layer.

An electron transporting compound ET-2 was evaporated on the blocking layer to form a 20-nm thick electron transporting layer.

LiF was evaporated on the electron transporting layer to form a 1-nm thick LiF film.

A metal Al was evaporated on the LiF film to form an 80-nm thick metal cathode.

Thus, the organic EL device of Example 12 was prepared. A device arrangement is also shown in Table 8.

Organic EL devices of Examples 13 and 14 were prepared in the same manner as that of Example 12 except that the material, the film thickness and the concentration of the dopant material were changed according to the device arrangement shown in Table 7.

TABLE 7

| | Device Arrangement |
|---|---|
| Example 12 | ITO/HT-1(5)/HT-2(30)/<br>PH-01:Ir(ppy)$_3$:Ir(pq)$_2$acac(5.10%:0.6%)/<br>SL-11(5)/PBH-1:PBD-1(30:20%)/<br>PBH-1(10)/ET-2(20)/LiF(1)/Al(80) |
| Example 13 | ITO/HT-1(5)/HT-2(30)/<br>SL-11:Ir(ppy)$_3$:Ir(pq)$_2$acac(5.10%:0.6%)/<br>SL-11(5)/PBH-1:PBD-1(30:20%)/<br>PBH-1(10)/ET-2(20)/LiF(1)/Al(80) |
| Example 14 | ITO/HT-1(5)/HT-2(25)/<br>PH-04:Ir(ppy)$_3$:Ir(pq)$_2$acac(10.10%:0.6%)/<br>SL-11(5)/PBH-1:PBD-1(30:20%)/<br>PBH-1(10)/ET-2(20)/LiF(1)/Al(80) |

The prepared organic EL devices were evaluated in the same manner as in Example 1 in terms of voltage, CIE1931 chromaticity, current efficiency L/J and external quantum efficiency EQE. It should be noted that each of the organic EL devices was evaluated under conditions that voltage was applied such that the current density was 1 mA/cm$^2$ and 10 mA/cm$^2$. A luminance intensity, an electrical power efficiency η and a peak wavelength λp (nm) of the EL emission spectra were also measured in the obtained spectral radiance spectrum. The results are shown in Table 8.

TABLE 8

| | voltage | current density | luminance intensity | chromaticity | | L/J | η | EQE | $\lambda_p$ |
|---|---|---|---|---|---|---|---|---|---|
| | [V] | [mA/cm$^2$] | [nit] | CIE x | CIE y | [cd/A] | [lm/W] | [%] | [nm] |
| Example 12 | 3.92 | 1 | 493 | 0.421 | 0.451 | 49.3 | 39.5 | 20.6 | 592 |
| | 4.75 | 10 | 4456 | 0.450 | 0.457 | 44.6 | 29.4 | 18.6 | 592 |
| Example 13 | 3.86 | 1 | 487 | 0.433 | 0.452 | 48.7 | 39.7 | 20.5 | 592 |
| | 4.73 | 10 | 4470 | 0.458 | 0.459 | 44.7 | 29.7 | 18.7 | 592 |
| Example 14 | 4.05 | 1 | 486 | 0.453 | 0.449 | 48.6 | 37.7 | 20.8 | 592 |
| | 5.13 | 10 | 4368 | 0.468 | 0.454 | 43.7 | 26.7 | 18.6 | 592 |

The invention claimed is:

1. An organic electroluminescence device comprising a pair of electrodes and an organic compound layer between the pair of electrodes, wherein
the organic compound layer comprises a plurality of emitting layers comprising a first emitting layer and a second emitting layer,
at least one of the first and second emitting layers comprises a phosphorescent dopant material,
the organic compound layer comprises a space layer between the first emitting layer and the second emitting layer, and
the space layer comprises a compound satisfying a relationship of a following numerical formula (1) in terms of a difference AST between singlet energy EgS and an energy gap Eg$_{77K}$ at 77K, $$\Delta ST = EgS - Eg_{77K} \leq 0.5 \text{ (eV)} \quad (1).$$

2. The organic electroluminescence device according to claim 1, wherein
the compound contained in the space layer has more than 80 nm of a half bandwidth of a photoluminescence spectrum.

3. The organic electroluminescence device according to claim 1, wherein
the compound contained in the space layer is a compound satisfying a following numerical formula (2) in terms of a refractive index n$_z$ in a direction perpendicular to a silicon substrate surface and a refractive index n$_x$ in a direction parallel to the silicon substrate surface by the spectroscopic ellipsometry method, $$\Delta n = |n_x - n_z| > 0.04 \quad (2).$$

4. The organic electroluminescence device according to claim 1, wherein
the singlet energy EgS of the compound contained in the space layer satisfies a relationship of a following numerical formula (3), $$EgS \geq 2.80 \text{ (eV)} \quad (3).$$

5. The organic electroluminescence device according to claim 1, wherein
the energy gap Eg$_{77K}$ of the compound contained in the space layer satisfies a relationship of a following numerical formula (4), $$Eg_{77K} > 2.70 \text{ (eV)} \quad (4).$$

6. The organic electroluminescence device according to claim 1, wherein
the first emitting layer comprises a phosphorescent dopant material, and
the second emitting layer comprises a fluorescent dopant material.

7. The organic electroluminescence device according to claim 6, further comprising:
a third emitting layer comprising a phosphorescent dopant material and provided adjacent to the first emitting layer comprising the phosphorescent dopant material.

8. The organic electroluminescence device according to claim 7, wherein
the third emitting layer comprises a host material which includes a compound having a hole mobility larger than an electron mobility.

9. The organic electroluminescence device according to claim 1, wherein
the first emitting layer and the second emitting layer each comprise a phosphorescent dopant material.

10. The organic electroluminescence device according to claim 9, further comprising:
a third emitting layer comprising a phosphorescent dopant material and provided adjacent to the first emitting layer comprising the phosphorescent dopant material.

11. The organic electroluminescence device according to claim 10, wherein
the third emitting layer comprises a host material which includes a compound having a hole mobility larger than an electron mobility.

12. The organic electroluminescence device according to claim 1, wherein
the first emitting layer comprises a host material which includes a compound having a hole mobility larger than an electron mobility.

13. An organic electroluminescence device comprising a pair of electrodes and an organic compound layer between the pair of electrodes, wherein the organic compound layer comprises at least one emitting layer and at least one charge transporting layer, and
the charge transporting layer comprises a compound satisfying a relationship of a following numerical formula (5) in terms of a difference $\Delta ST$ between singlet energy $EgS$ and an energy gap $Eg_{77K}$ at 77K, $$\Delta ST = EgS - Eg_{77K} \leq 0.5 \text{ (eV)} \tag{5}$$

14. The organic electroluminescence device according to claim 13, wherein
the compound contained in the charge transporting layer has more than 80 nm of a half bandwidth of a photoluminescence spectrum.

15. The organic electroluminescence device according to claim 13, wherein
the compound contained in the charge transporting layer is a compound satisfying a following numerical formula (6) in terms of a refractive index $n_Z$ in a direction perpendicular to a silicon substrate surface and a refractive index $n_X$ in a direction parallel to the silicon substrate surface by a spectroscopic ellipsometry method, $$\Delta n = |n_X - n_Z| > 0.04 \tag{6}$$

* * * * *

UNITED STATES PATENT AND TRADEMARK OFFICE
CERTIFICATE OF CORRECTION

PATENT NO. : 8,847,218 B2
APPLICATION NO. : 13/980051
DATED : September 30, 2014
INVENTOR(S) : Nishimura et al.

It is certified that error appears in the above-identified patent and that said Letters Patent is hereby corrected as shown below:

In the Claims

Column 56, Line 11, Claim 1 "AST" should read -- $\Delta$ST --.

Column 56, Line 13, Claim 1 "$\Delta ST = EgS - Eg_{77K} = 50.5$ (eV)" should read -- $\Delta ST = EgS - Eg_{77K} \leq 0.5$ (eV) --.

Column 56, Line 42, Claim 5 "$Eg_{77K} > 2.70$ (eV)" should read -- $Eg_{77K} \geq 2.70$ (eV) --.

Column 58, Line 5, Claim 13 "AST" should read -- $\Delta$ST --.

Column 58, Line 8, Claim 13 "$\Delta ST = EgS - Eg_{77K} \leq 50.5$ (eV)" should read -- $\Delta ST = EgS - Eg_{77K} \leq 0.5$ (eV) --.

Signed and Sealed this
Twenty-ninth Day of March, 2016

Michelle K. Lee
*Director of the United States Patent and Trademark Office*